United States Patent
Matsumoto

(10) Patent No.: US 10,319,564 B2
(45) Date of Patent: Jun. 11, 2019

(54) MULTI CHARGED PARTICLE BEAM WRITING APPARATUS, AND MULTI CHARGED PARTICLE BEAM WRITING METHOD

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/790,115

(22) Filed: Oct. 23, 2017

(65) Prior Publication Data

US 2018/0114673 A1    Apr. 26, 2018

(30) Foreign Application Priority Data

Oct. 26, 2016    (JP) .................................. 2016-209987

(51) Int. Cl.
  *H01J 37/317*    (2006.01)
  *H01J 37/302*    (2006.01)

(52) U.S. Cl.
  CPC ...... *H01J 37/3177* (2013.01); *H01J 37/3026* (2013.01); *H01J 2237/31774* (2013.01); *H01J 2237/31776* (2013.01)

(58) Field of Classification Search
  USPC ...................................................... 250/492.3
  See application file for complete search history.

(56) References Cited

U.S. PATENT DOCUMENTS

| | | | | |
|---|---|---|---|---|
| 6,768,125 B2 * | 7/2004 | Platzgummer | ......... | B82Y 10/00 250/492.1 |
| 7,405,414 B2 * | 7/2008 | Sandstrom | .......... | G03F 7/70283 250/365 |
| 8,969,837 B2 * | 3/2015 | Matsumoto | ......... | H01J 37/3177 250/396 R |
| 2016/0071692 A1 | 3/2016 | Ogasawara | | |

FOREIGN PATENT DOCUMENTS

| | | |
|---|---|---|
| JP | 2004-040076 A | 2/2004 |
| JP | 2016-58714 | 4/2016 |
| KR | 10-2016-0113992 | 4/2016 |

OTHER PUBLICATIONS

Office Action dated Mar. 18. 2019, in Korean Patent Application No. 10-2017-0138424, w/English Machine Translation.

\* cited by examiner

*Primary Examiner* — Phillip A Johnston
(74) *Attorney, Agent, or Firm* — Oblon, McClelland, Maier & Neustadt, L.L.P.

(57) ABSTRACT

A multi charged particle beam writing apparatus includes an irradiation time calculation circuit to calculate an irradiation time of a beam to each pixel, for each of a plurality of pixels which are obtained by dividing a writing region of a target object and each of which serves as an irradiation unit region per beam of multi charged particle beams, a gray-scale value calculation circuit to calculate, for each pixel, a gray-scale value of gradation by gray scale levels by dividing the irradiation time by a quantization unit, and a gray-scale value correction circuit to correct, for each of a plurality of groups each composed of adjacent pixels, dose errors each caused by gradation, by gray scale levels, of the irradiation time which occur in the adjacent pixels in a group concerned, by increasing or decreasing the gray-scale value of at least one pixel in the group concerned by 1.

10 Claims, 18 Drawing Sheets

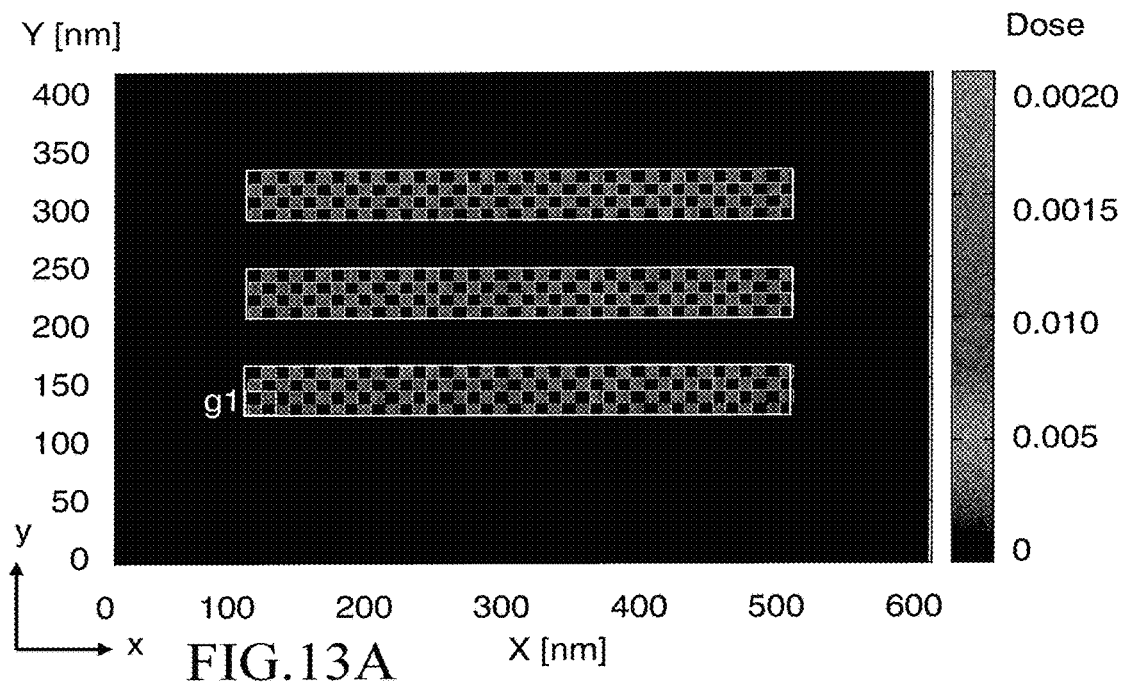
FIG.13A
FIG.13B
| 3 | 2 |
|---|---|
| 1 | 4 |
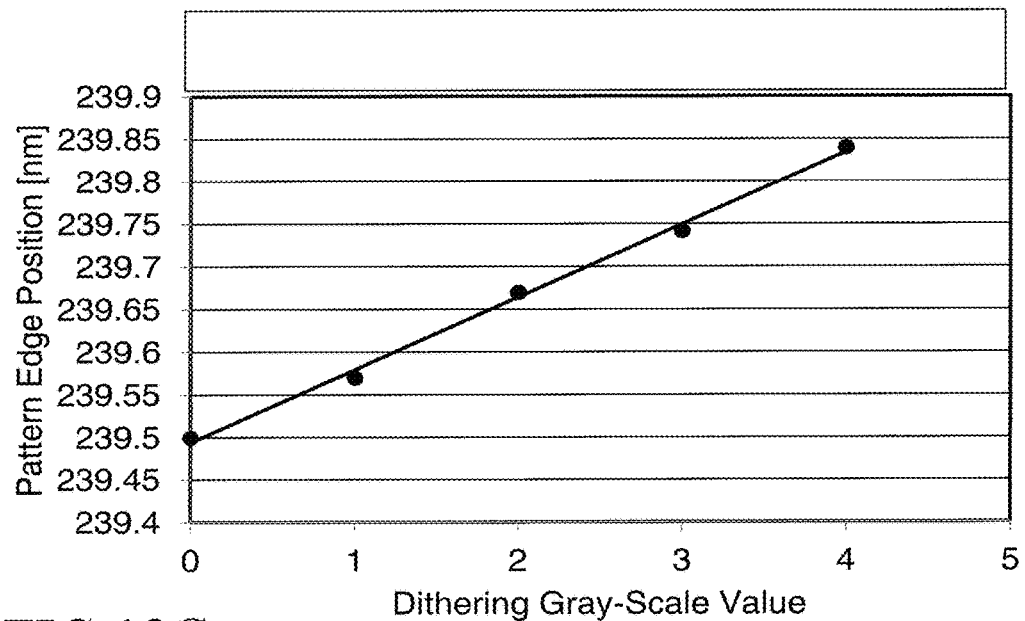
FIG.13C

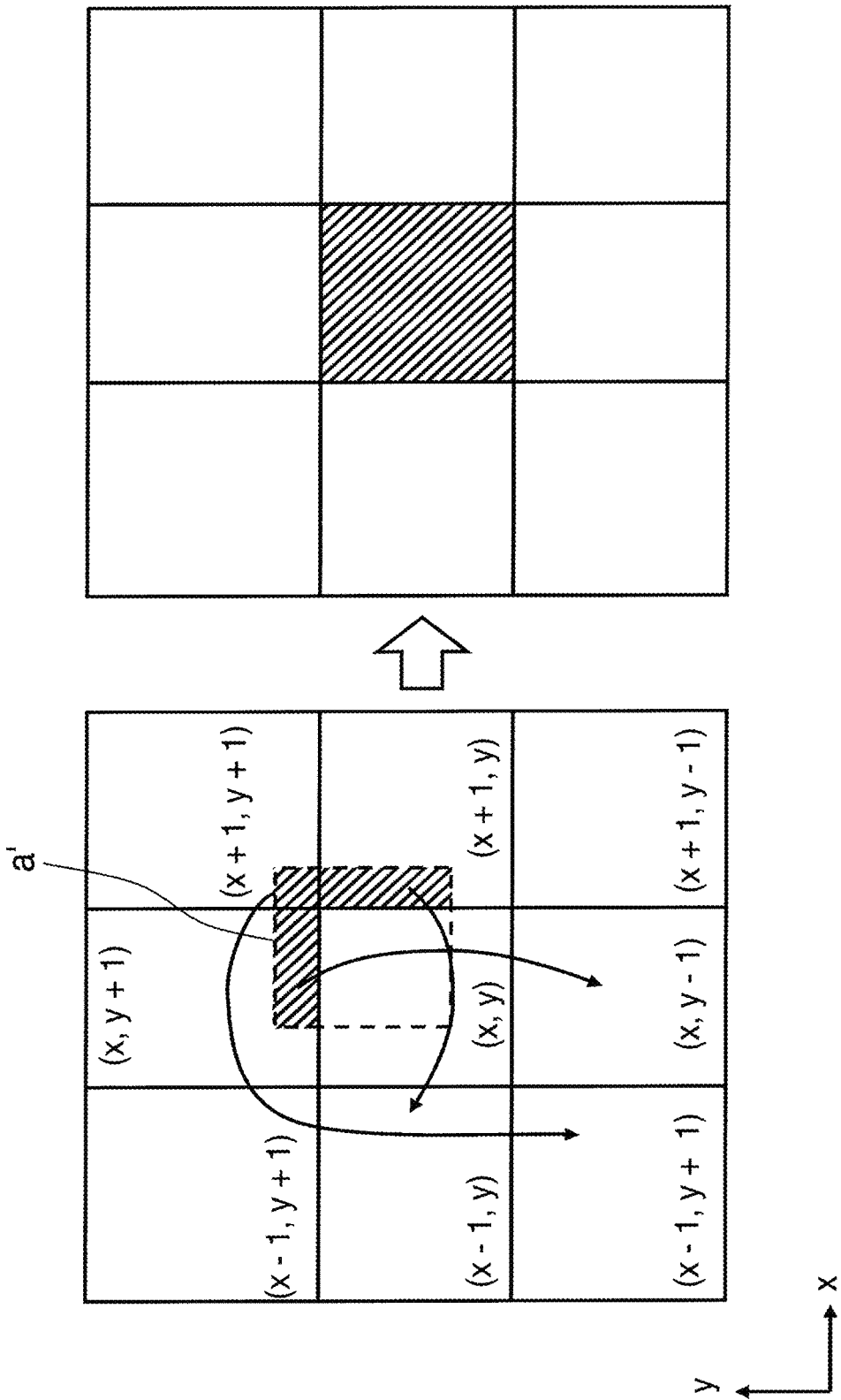

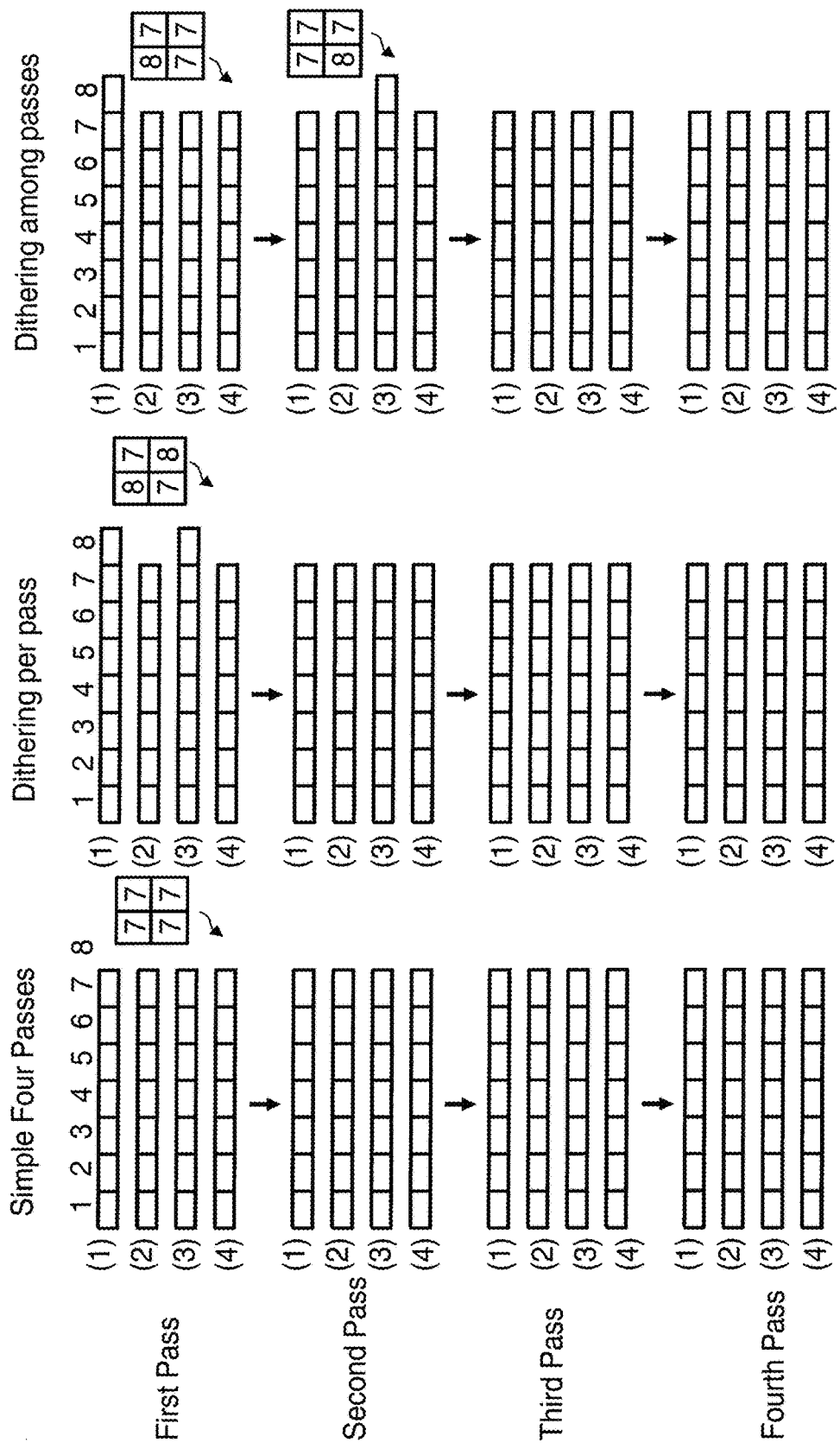

MULTI CHARGED PARTICLE BEAM WRITING APPARATUS, AND MULTI CHARGED PARTICLE BEAM WRITING METHOD

CROSS-REFERENCE TO RELATED APPLICATION

This application is based upon and claims the benefit of priority from the prior Japanese Patent Application No. 2016-209987 filed on Oct. 26, 2016 in Japan, the entire contents of which are incorporated herein by reference.

BACKGROUND OF THE INVENTION

Field of the Invention

Embodiments of the present invention relate to a multi charged particle beam writing apparatus and a multi charged particle beam writing method, and, for example, to a method for correcting an error of a gray-scale value based on which the irradiation time is controlled in multi beam writing.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits becomes progressively narrower year by year. The electron beam writing technique which intrinsically has excellent resolution is used for writing or "drawing" a mask pattern on a mask blank with electron beams.

For example, as a known example of employing the electron beam writing technique, there is a writing apparatus using multi-beams. Since it is possible for multi-beam writing to irradiate multiple beams at a time, the writing throughput can be greatly increased in comparison with single electron beam writing. For example, a writing apparatus employing the multi-beam technique forms multi-beams by letting portions of an electron beam emitted from an electron gun pass through a corresponding hole of a plurality of holes in a mask, performs blanking control for each beam, reduces each unblocked beam by an optical system in order to reduce a mask image, and deflects the beam by a deflector so as to irradiate a desired position on a target object or "sample".

In multi-beam writing, the dose of each beam is controlled by irradiation time. The irradiation time is defined by n-bit gray-scale value data. Accordingly, the irradiation time can be controlled by a control signal of 0 to $(2^n-1)$ gray scale level of gradation by gray scale levels. As the number of bits of the control signal increases, the data volume also increases due to the increased number of bits. In multi-beam writing, since irradiation of many beams is performed at a time, it is necessary to transmit a lot of irradiation time data corresponding to the number of beams in a short time. Thus, writing time is greatly affected by the time needed for transmitting data. Therefore, the data volume of irradiation time data is preferably as small as possible.

On the other hand, if performing dose correction, such as proximity effect correction, the range of dose modulation for a dose applied onto each irradiation position needs to be several hundred percent, for example, compared with respect to a base dose. For example, in the case of defining the irradiation time corresponding to a dose by gray-scale values of 0 to L gray level, there is a gray scale level error per gray level due to gradation by gray scale levels, where the error is (hundreds/L) % at the maximum. With recent micropatterning and increase in accuracy, pattern dimension variation associated with such error of gradation by gray scale levels is not negligible. If increasing the maximum gray-scale value L, the resolution can be increased and an error of gradation by gray scale levels can be reduced. However, as described above, data volume increases due to the increased maximum gray-scale value L, thus resulting in a problem in that the writing time becomes long.

Although not being a method for correcting errors of gradation, by gray scale levels, irradiation time, it is proposed, when fractional values (digits after the decimal point) are generated in representing a desired dose by integer values, to add an integer value close to the sum of fractional values of each pixel in a group to a central pixel in the group (e.g., refer to Japanese Patent Application Laid-open (JP-A) No. 2016-058714).

Critical dimension (line width) CD of a pattern to be written can be controlled by dose modulation of a pixel located close to the edge of the pattern. Therefore, if an error of gradation by gray scale levels occurs in the irradiation time to irradiate a pixel located close to the edge, the dimension deviates (shifts) due to the error of the gradation by gray scale levels.

BRIEF SUMMARY OF THE INVENTION

According to one aspect of the present invention, a multi charged particle beam writing apparatus includes an irradiation time calculation circuit configured to calculate an irradiation time of a beam to each pixel, for the each pixel of a plurality of pixels which are obtained by dividing a writing region of a target object and each of which serves as an irradiation unit region per beam of multi charged particle beams, a gray-scale value calculation circuit configured to calculate, for the each pixel, a gray-scale value of gradation by gray scale levels by dividing the irradiation time by a quantization unit, a gray-scale value correction circuit configured to correct, for each group of a plurality of groups each composed of adjacent pixels, dose errors each caused by the gradation, by gray scale levels, of the irradiation time which occur in the adjacent pixels in a group concerned in the plurality of groups, by performing one of increasing and decreasing the gray-scale value of at least one pixel in the group concerned by 1, and a writing mechanism configured to include a shaping aperture array substrate which forms the multi charged particle beams, a deflector which deflects the multi charged particle beams, and a stage on which the target object is placed, and to write a pattern on the target object with the multi charged particle beams, based on a gray-scale value of the each pixel in the each group for which the dose errors each caused by the gradation by gray scale levels have been corrected.

According to another aspect of the present invention, a multi charged particle beam writing method includes calculating an irradiation time of a beam to each pixel, for the each pixel of a plurality of pixels which are obtained by dividing a writing region of a target object and each of which serves as an irradiation unit region per beam of multi charged particle beams, calculating, for the each pixel, a gray-scale value of gradation by gray scale levels by dividing the irradiation time by a quantization unit, correcting, for each group of a plurality of groups each composed of adjacent pixels, dose errors each caused by the gradation, by gray scale levels, of the irradiation time which occur in the adjacent pixels in a group concerned in the plurality of groups, by performing one of increasing and decreasing the gray-scale value of at least one pixel in the each group by 1, and writing a pattern on the target object with the multi charged particle beams, based on a gray-scale value of the each pixel in the each group for which the dose errors each caused by the gradation by gray scale levels have been corrected.

BRIEF DESCRIPTION OF THE DRAWINGS

FIGS. 13A to 13C are for explaining an example of resolution enhancement by dithering according to the first embodiment;

FIGS. 17A and 17B illustrate an example of a method of correcting a positional deviation according to the second embodiment;

FIGS. 19A to 19C show examples of performing a correction of gradation by gray scale levels by dithering processing in the case of multiple writing according to the first and second embodiments.

DETAILED DESCRIPTION OF THE INVENTION

Embodiments below describe a multi charged particle beam writing apparatus and method which can correct errors of gradation, by gray scale levels, of irradiation time in multi-beam writing.

In the embodiments below, there will be described a configuration in which an electron beam is used as an example of a charged particle beam. The charged particle beam is not limited to the electron beam, and other charged particle beam such as an ion beam may also be used.

First Embodiment

Figure 1:
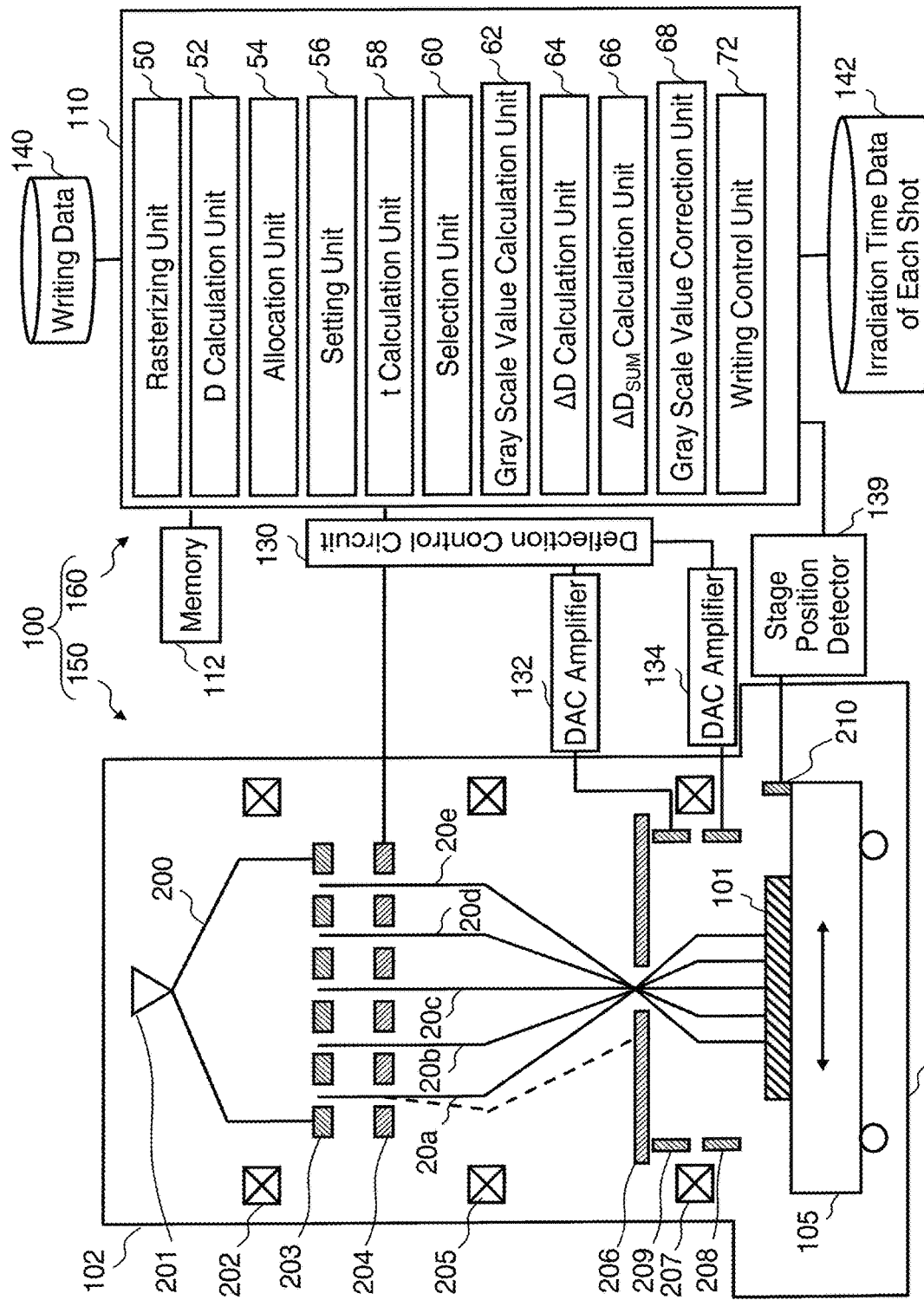
FIG. 1 is a schematic diagram showing a configuration of a writing or "drawing" apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control system circuit 160. The writing apparatus 100 is an example of a multi charged particle beam writing apparatus. The writing mechanism 150 includes an electron optical column 102 (multi electron beam column) and a writing chamber 103. In the electron optical column 102, there are arranged an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, there is arranged an XY stage 105. On the XY stage 105, a target object or "sample" 101 such as a mask blank on which resist is applied, serving as a writing target substrate, is placed when writing is performed. The target object 101 is, for example, an exposure mask used for fabricating semiconductor devices, or a semiconductor substrate (silicon wafer) for fabricating semiconductor devices. Moreover, a mirror 210 for measuring the position of the XY stage 105 is arranged on the XY stage 105.

The control system circuit 160 includes a control computer 110, a memory 112, a deflection control circuit 130, a DAC (digital-analog converter) amplifier units 132 and 134, a stage position measuring instrument 139, and storage devices 140 and 142 such as magnetic disk drives. The control computer 110, the memory 112, the deflection control circuit 130, the DAC amplifier units 132 and 134, the stage position measuring instrument 139, and the storage devices 140 and 142 are connected with each other through a bus (not shown). The deflection control circuit 130 is connected to the DAC amplifier units 132 and 134, and the blanking aperture array mechanism 204. The DAC amplifier unit 137 is connected to the lens control circuit 136. The output of the DAC amplifier unit 132 is connected to the deflector 209. The output of the DAC amplifier unit 134 is connected to the deflector 208. The stage position measuring instrument 139 irradiates the mirror 210 on the XY stage 105 with a laser beam, and receives a reflected light from the mirror 210. Then, the stage position measuring instrument 139 measures the position of the XY stage 105 by using information of the reflected light.

In the control computer 110, there are arranged a rasterizing unit 50, a dose D calculation unit 52, an allocation unit 54, a setting unit 56, an irradiation time t calculation unit 58, a selection unit 60, a gray-scale value calculation unit 62, a dose error $\Delta D$ calculation unit 64, a dose error sum $\Delta D_{sum}$ calculation unit 66, a gray-scale value correction unit 68, and a writing control unit 72. Each of the "... units" such as the rasterizing unit 50, the dose D calculation unit 52, the allocation unit 54, the setting unit 56, the irradiation time t calculation unit 58, the selection unit 60, the gray-scale value calculation unit 62, the dose error $\Delta D$ calculation unit 64, the dose error sum $\Delta D_{sum}$ calculation unit 66, the gray-scale value correction unit 68, and the writing control unit 72 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Data which is input and output to/from the rasterizing unit 50, the dose D calculation unit 52, the allocation unit 54, the setting unit 56, the irradiation time t calculation unit 58, the selection unit 60, the gray-scale value calculation unit 62, the dose error $\Delta D$ calculation unit 64, the dose error sum $\Delta D_{sum}$ calculation unit 66, the gray-scale value correction unit 68, and the writing control unit 72, and data being operated are stored in the memory 112 each time.

Moreover, writing data is input from the outside of the writing apparatus 100, and stored in the storage device 140. The writing data usually defines information on a plurality of figure patterns to be written. Specifically, it defines a figure code, coordinates, size, etc. for each figure pattern.

FIG. 1 shows configuration elements necessary for describing the first embodiment. It should be understood that other configuration elements generally necessary for the writing apparatus 100 may also be included therein.

Figure 2:
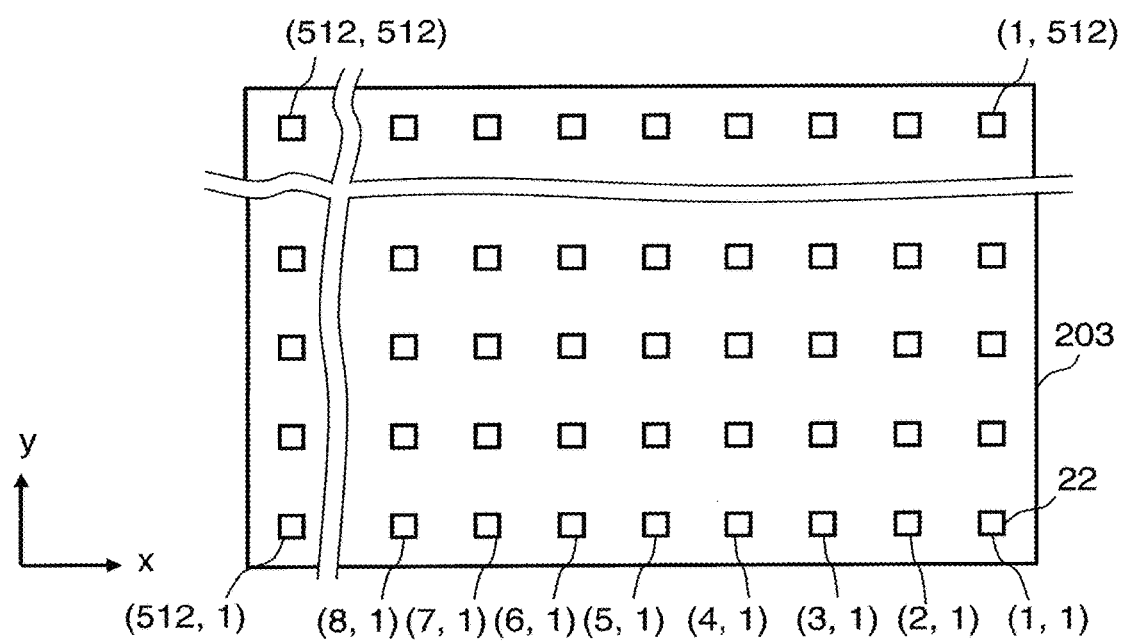
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In FIG. 2, for example, holes 22 of 512 (rows of holes arrayed in the y direction)×512 (columns of holes arrayed in the x direction) are formed. Each of the holes 22 is a quadrangle having the same dimension, shape, and size. Alternatively, each of the holes 22 may be a circle with the same diameter. Multi-beams 20 are formed by letting portions of an electron beam 200 individually pass through a corresponding hole of a plurality of holes 22. Shown here is the case where the holes 22 of two or more rows and columns are arranged horizontally and vertically (in the x and y directions), but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. Moreover, the method of arranging the holes 22 is not limited to the case of FIG. 2 where holes are arranged like a grid in the length and width directions. For example, with respect to the k–th and the (k+1)th rows arrayed in the length direction (y direction), each hole in the k-th row and each hole in the (k+1)th row may be mutually displaced in the width direction (x direction) by a dimension "a". Similarly, with respect to the (k+1)th and the (k+2)th rows arrayed in the length direction (y direction), each hole in the (k+1)th row and each hole in the (k+2)th row may be mutually displaced in the width direction (x direction) by a dimension "b", for example.

Figure 3:
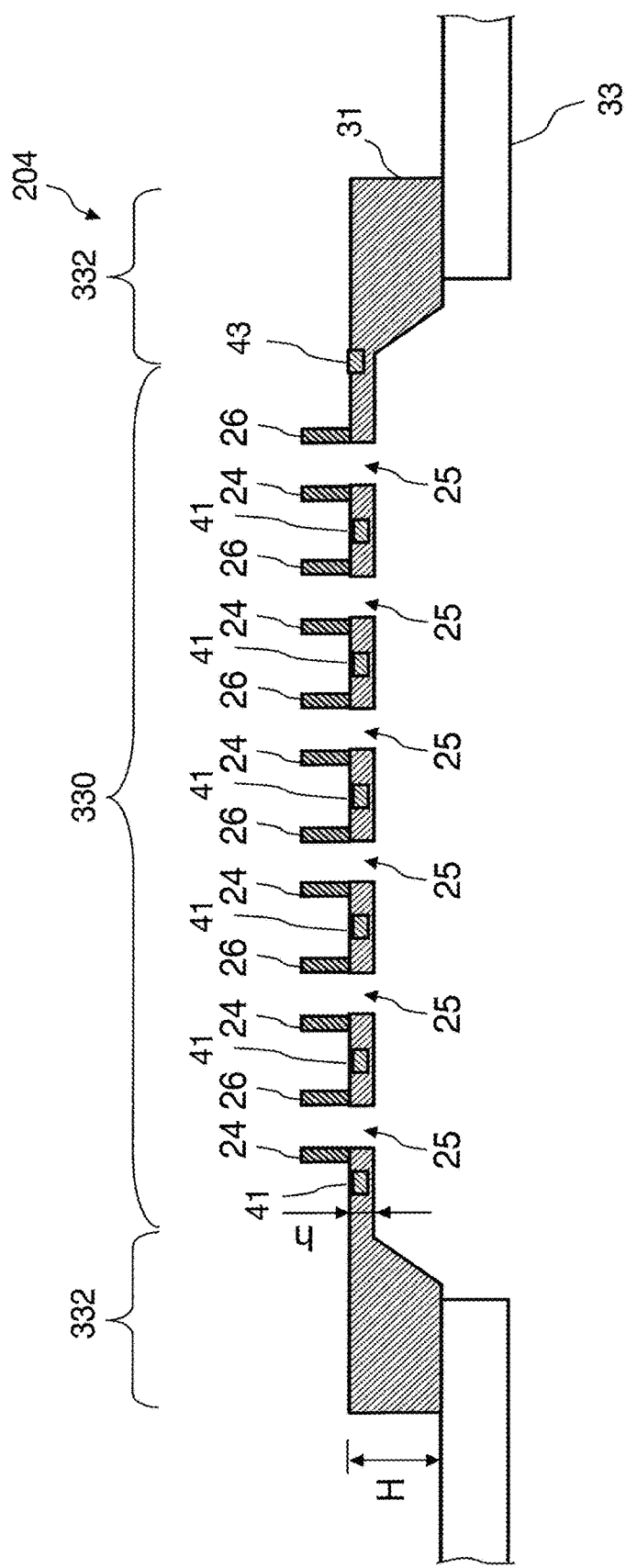
FIG. 3 is a sectional view showing the configuration of a blanking aperture array mechanism according to the first embodiment.

FIG. 3 is a sectional view showing the configuration of a blanking aperture array mechanism according to the first embodiment.

Figure 4:
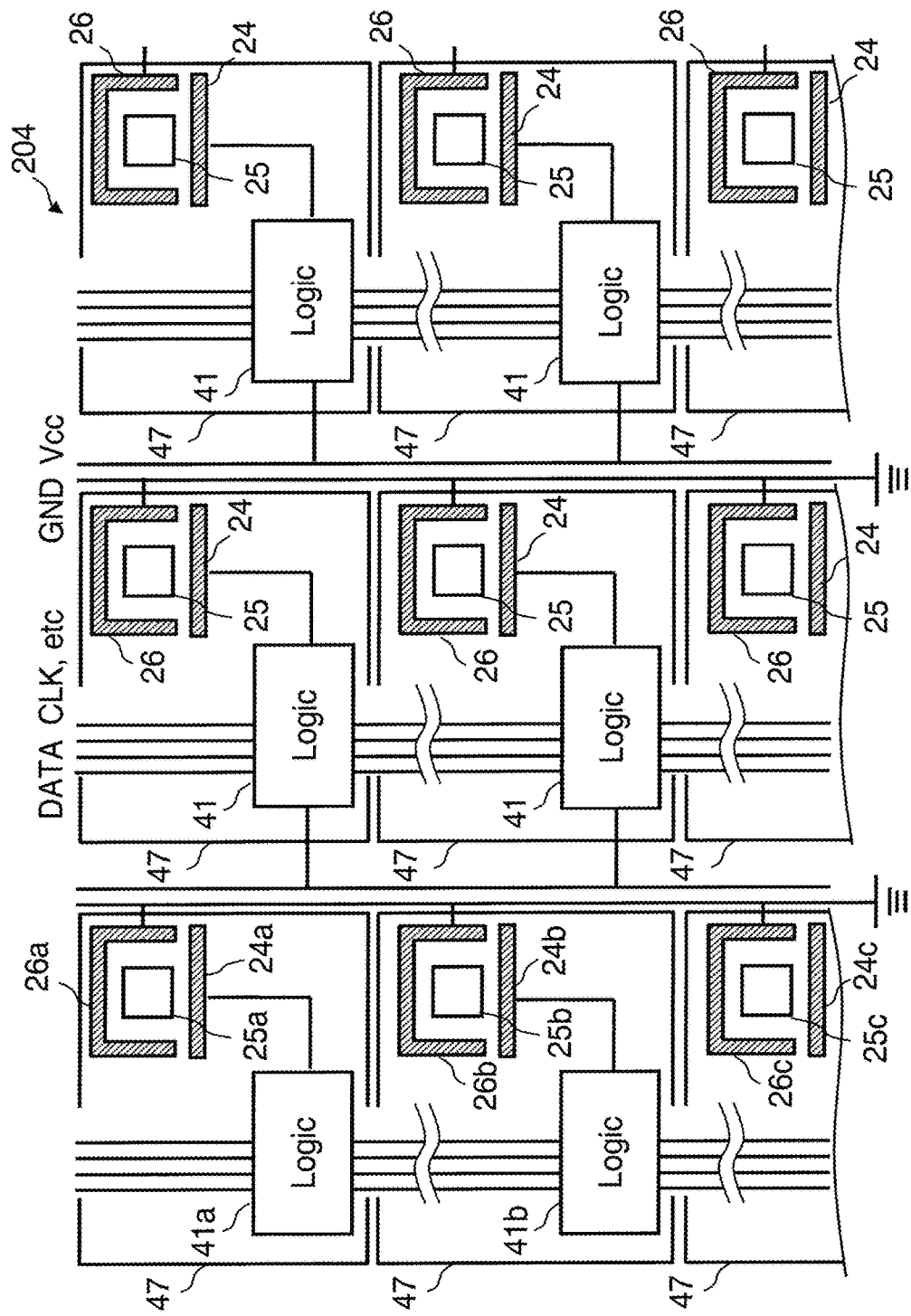
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. Between FIGS. 3 and 4, the positional relation among a control electrode 24, a counter electrode 26, a control circuit 41, and a pad 43 is not in accordance with each other. With regard to the structure of the blanking aperture array mechanism 204, as shown in FIG. 3, a semiconductor substrate 31 made of silicon, etc. is placed on a support table 33. The central part of the substrate 31 is shaved from the back side, and made into a membrane region 330 (first region) having a thin film thickness h. The circumference surrounding the membrane region 330 is a circumferential region 332 (second region) having a thick film thickness H. The upper surface of the membrane region 330 and the upper surface of the circumferential region 332 are formed to be flush in height with each other, or substantially flush in height with each other. At the back side of the circumferential region 332, the substrate 31 is supported on the support table 33. The central part of the support table 33 is open, and the membrane region 330 is located at the opening portion of the support table 33.

In the membrane region 330, there are formed passage holes 25 (openings), through each of which a corresponding one of multi-beams passes, at positions each corresponding to each hole 22 of the shaping aperture array substrate 203 shown in FIG. 2. In other words, in the membrane region 330 of the substrate 31, there are formed a plurality of passage holes 25 in an array through each of which a corresponding beam of electron multi-beams passes. Moreover, in the membrane region 330 of the substrate 31, a plurality of electrode pairs each composed of two electrodes arranged to be opposite each other with respect to a corresponding one of a plurality of passage holes 25. Specifically, in the membrane region 330, as shown in FIGS. 3 and 4, each pair of the control electrode 24 and the counter electrode 26 (blanker: blanking deflector) for blanking deflection is arranged close to a corresponding passage hole 25 in a manner such that the electrodes 24 and 26 are facing each other across the passage hole 25 concerned. Moreover, close to each passage hole 25 in the membrane region 330 of the substrate 31, there is arranged the control circuit 41 (logic circuit) for applying a deflection voltage to the control electrode 24 for the passage hole 25 concerned. The counter electrode 26 for each beam is grounded (earthed).

As shown in FIG. 4, n-bit (e.g., 10-bit) parallel lines for control signals are connected to each control circuit 41. In addition to the n-bit parallel lines for controlling signals, lines for a clock signal, read signal, shot signal, power supply, and the like are connected to each control circuit 41. A part of the parallel lines may be used as the lines for a clock signal, read signal, shot signal, power supply, and the like. An individual blanking mechanism 47 composed of the control electrode 24, the counter electrode 26, and the control circuit 41 is configured for each of the multi-beams. In the example of FIG. 3, the control electrode 24, the counter electrode 26, and the control circuit 41 are arranged in the membrane region 330 having a thin film thickness of the substrate 31. However, it is not limited thereto. A plurality of control circuits 41 formed in an array in the membrane region 330 are grouped per row or per column, and the control circuits 41 in each group are connected in series as shown in FIG. 4. The pad 43 arranged for each group sends a signal to the control circuits 41 in the group concerned. Specifically, a shift register (not shown) is arranged in each control circuit 41, and for example, shift registers in the control circuits for beams in the same row in p×q multiple beams, for example, are connected in series. For example, control signals for beams in the same row in the p×q multiple beams are transmitted in series. For example, a control signal for each beam is stored in a corresponding control circuit 41 by p clock signals.

Figure 5:
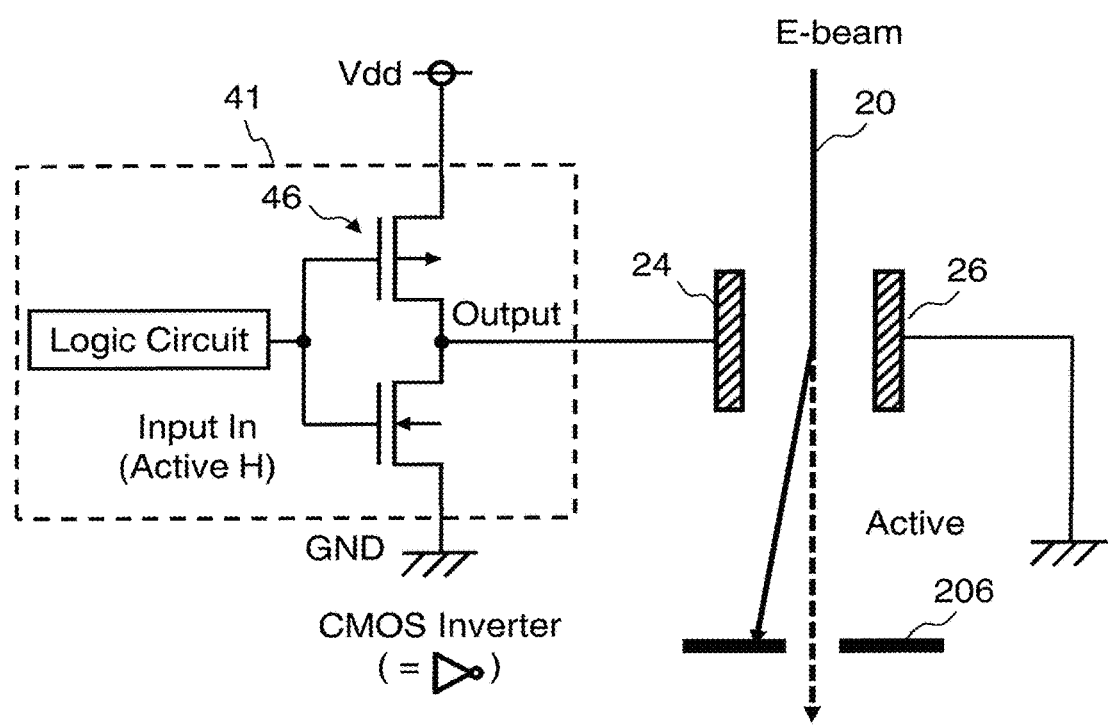
FIG. 5 shows an example of an individual blanking mechanism according to the first embodiment.

FIG. 5 shows an example of an individual blanking mechanism according to the first embodiment. As shown in FIG. 5, an amplifier 46 (an example of a switching circuit)

is arranged in the control circuit 41. In the case of FIG. 5, a CMOS (complementary MOS) inverter circuit is arranged as an example of the amplifier 46. The CMOS inverter circuit is connected to a positive potential (Vdd: blanking electric potential: first electric potential) (e.g., 5 V) (first electric potential) and to a ground potential (GND: second electric potential). The output line (OUT) of the CMOS inverter circuit is connected to the control electrode 24. On the other hand, the counter electrode 26 is applied with a ground electric potential. A plurality of control electrodes 24, each of which is applied with a blanking electric potential and a ground electric potential in a switchable manner, are arranged on the substrate 31 such that the control electrode 24 and the corresponding counter electrode 26 are opposite each other with respect to a corresponding one of a plurality of passage holes 25.

As an input (IN) of each CMOS inverter circuit, either an L (low) electric potential (e.g., ground potential) lower than a threshold voltage, or an H (high) electric potential (e.g., 1.5 V) higher than or equal to the threshold voltage is applied as a control signal. According to the first embodiment, in a state (active state) where an L electric potential is applied to the input (IN) of the CMOS inverter circuit, the output (OUT) of the CMOS inverter circuit becomes a positive potential (Vdd), and then, a corresponding beam 20 is deflected by an electric field due to a potential difference from the ground potential of the counter electrode 26 so as to be blocked by the limiting aperture substrate 206, thereby becoming in a beam OFF condition. On the other hand, in a state (active state) where an H electric potential is applied to the input (IN) of the CMOS inverter circuit, the output (OUT) of the CMOS inverter circuit becomes a ground potential, and therefore, since there is no potential difference from the ground potential of the counter electrode 26, a corresponding beam 20 is not deflected, thereby becoming in a beam ON condition by letting the beam concerned pass through the limiting aperture substrate 206.

The electron beam 20 passing through a corresponding passage hole is deflected by a voltage independently applied to the control electrode 24 and the counter electrode 26 being a pair. Blanking control is performed by this deflection. Specifically, a pair of the control electrode 24 and the counter electrode 26 individually provides blanking deflection of a corresponding beam of multi-beams by an electric potential switched by the CMOS inverter circuit which serves as a corresponding switching circuit. Thus, each of a plurality of blankers performs blanking deflection of a corresponding beam in the multi-beams having passed through a plurality of holes 22 (openings) of the shaping aperture array substrate 203.

Figure 6:
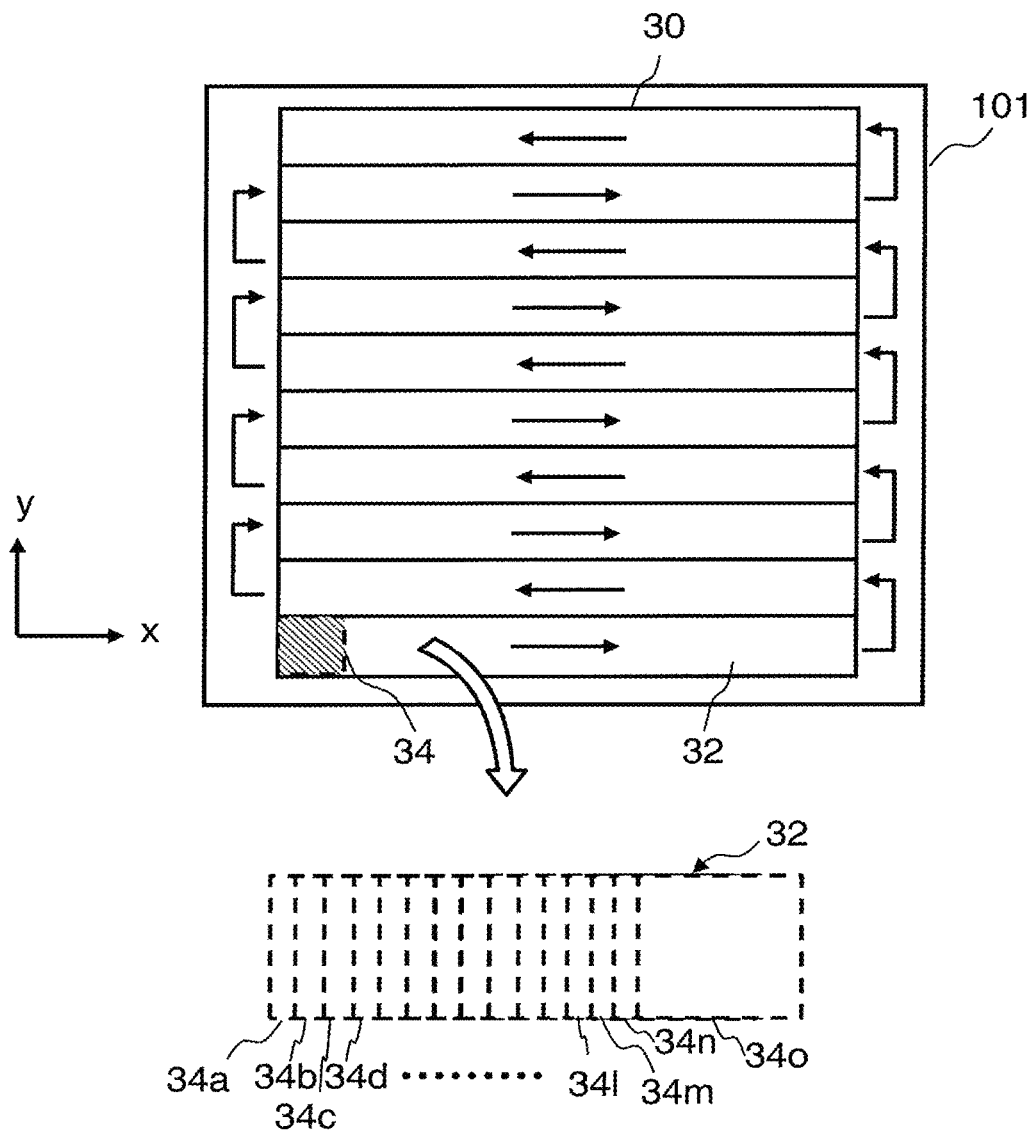
FIG. 6 is a conceptual diagram explaining an example of a writing operation according to the first embodiment.

FIG. 6 is a conceptual diagram explaining an example of a writing operation according to the first embodiment. As shown in FIG. 6, a writing region 30 of the target object 101 is virtually divided by a predetermined width in the y direction into a plurality of strip-shaped stripe regions 32, for example. First, the XY stage 105 is moved to make an adjustment such that an irradiation region 34 which can be irradiated with one shot of the multi-beams 20 is located at the left end of the first stripe region 32 or at a position more left than the left end, and then writing is started. When writing the first stripe region 32, the XY stage 105 is moved, for example, in the -x direction, so that the writing advances relatively in the x direction. The XY stage 105 is moved, for example, continuously at a constant speed. After writing the first stripe region 32, the stage position is moved in the -y direction to make an adjustment such that the irradiation region 34 is located at the right end of the second stripe region 32 or at a position more right than the right end and located relatively in the y direction. Then, by moving the XY stage 105 in the x direction, for example, writing similarly advances in the -x direction. That is, writing is performed while alternately changing the direction, such as performing writing in the x direction in the third stripe region 32, and in the -x direction in the fourth stripe region 32, thereby reducing the writing time. However, the writing operation is not limited to writing while alternately changing the direction, and it is also preferable to perform writing in the same direction when writing each stripe region 32. A plurality of shot patterns up to as many as the number of the holes 22 are formed at a time by one shot of multi-beams having been formed by passing through the holes 22 in the shaping aperture array substrate 203.

Figure 7:
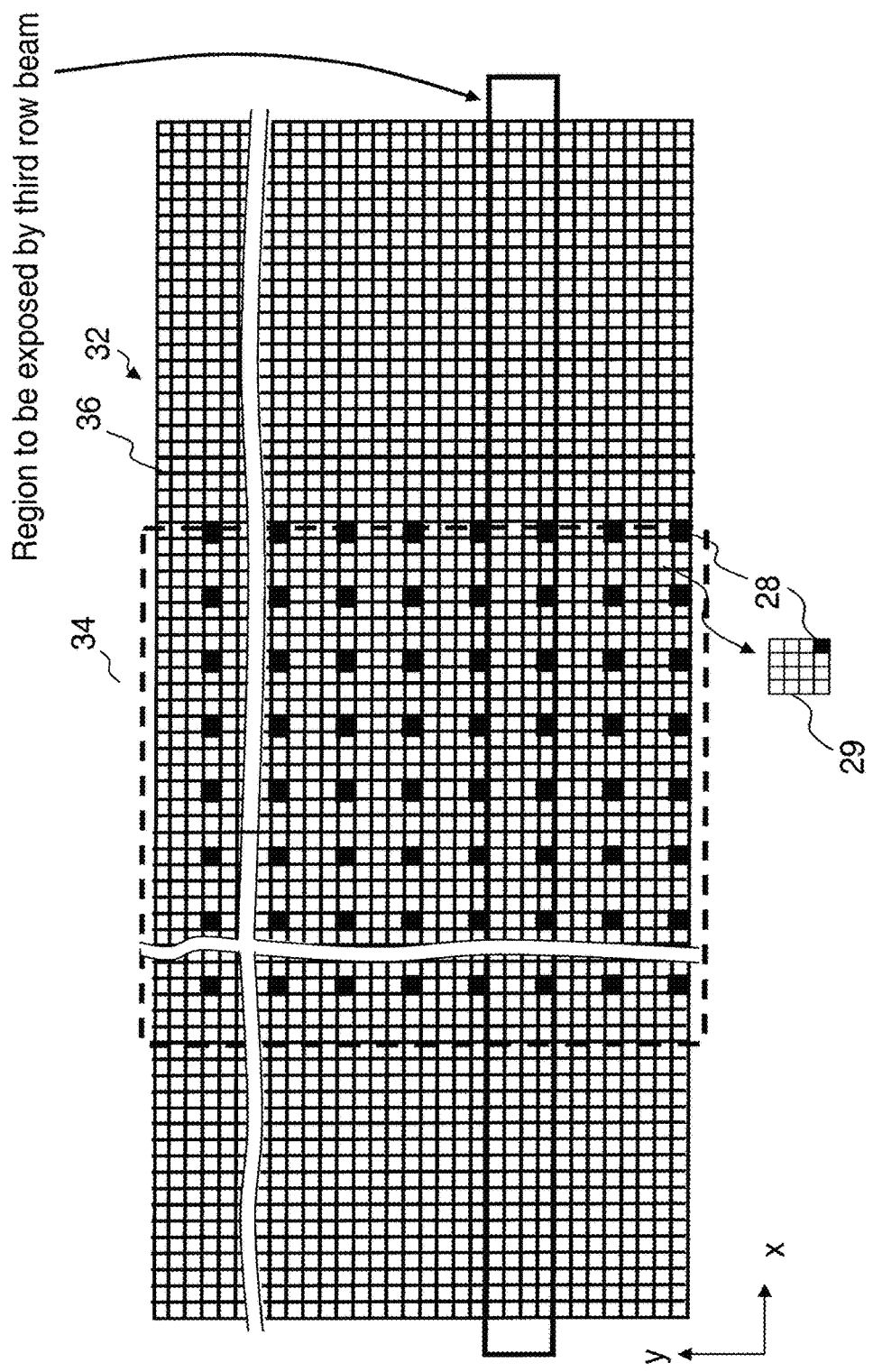
FIG. 7 shows an example of an irradiation region of multi-beams and a pixel to be written according to the first embodiment.

FIG. 7 shows an example of an irradiation region of multi-beams and a pixel to be written (writing pixel) according to the first embodiment. In FIG. 7, the stripe region 32 is divided into a plurality of mesh regions by the beam size of each of the multi-beams, for example. For example, it is preferable to divide the stripe region 32 into the size of about 10 nm. Each mesh region serves as a writing pixel 36 (unit irradiation region, irradiation position, or writing position). The size of the writing pixel 36 is not limited to the beam size, and may be an arbitrary size regardless of the beam size. For example, it may be 1/n (n being an integer of 1 or more) of the beam size. A mesh region (pixel) is an irradiation unit region per beam of multi-beams. FIG. 7 shows the case where the writing region of the target object 101 is divided, for example, in the y direction, into a plurality of stripe regions 32 by the width size being substantially the same as the size of the irradiation region 34 (writing field) which can be irradiated with one irradiation of the multi-beams 20, for example. The width of the stripe region 32 is not limited to this. Preferably, the width of the stripe region 32 is n times (n being an integer of 1 or more) the size of the irradiation region 34. FIG. 7 shows the case of multi-beams of 512 (rows)×512 (columns) being simplified to 8×8. In the irradiation region 34, there are shown a plurality of pixels 28 (beam writing positions) which can be irradiated with one shot of the multi-beams 20. In other words, the pitch between the adjacent pixels 28 is the pitch between beams of the multi-beams. In the example of FIG. 7, one grid 29 is a square region surrounded by four adjacent pixels 28 at four corners and including one of the four pixels 28. In the example of FIG. 7, each grid 29 is composed of 4×4 pixels.

Figure 8:
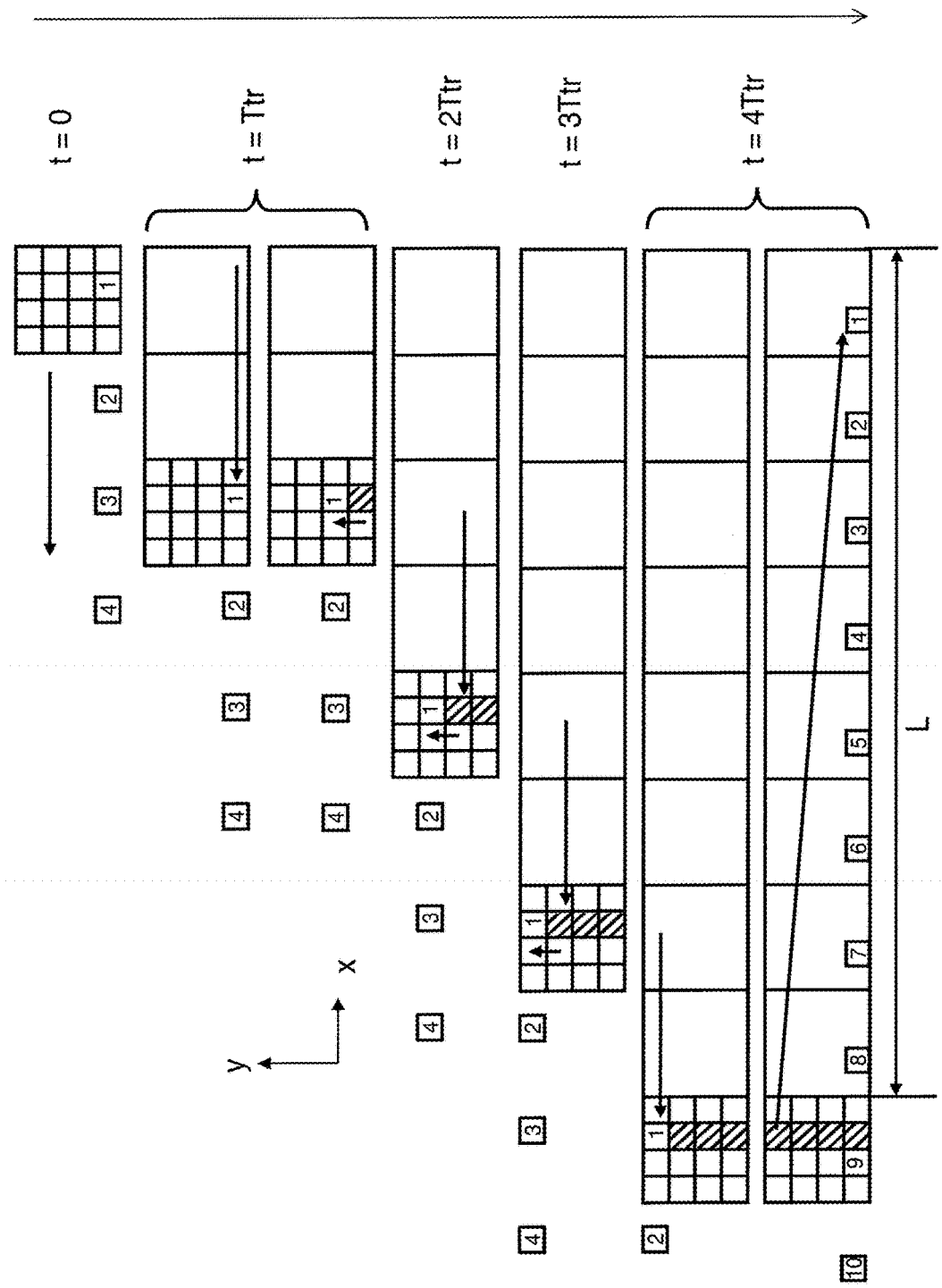
FIG. 8 illustrates an example of a writing method of multi-beams according to the first embodiment.

FIG. 8 illustrates an example of a writing method of multi-beams according to the first embodiment. FIG. 8 shows some grids to be written by respective beams at the coordinates (1, 3), (2, 3), (3, 3), . . . , (512, 3) in the third row from the bottom in the multi-beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collectively deflecting the entire multi-beams 20 by the deflector 208. In other words, tracking control is performed. In the example of FIG. 8, one tracking cycle is executed by writing (exposing) four pixels while moving the distance of eight beam pitches.

Specifically, the stage position measuring instrument 139 measures the position of the XY stage 105 by irradiating the mirror 210 with a laser and receiving a reflected light from the mirror 210. The measured position of the XY stage 105 is output to the control computer 110. In the control computer 110, the writing control unit 72 outputs the position information on the XY stage 105 to the deflection control circuit 130. The deflection control circuit 130 calculates deflection amount data (tracking deflection data) for deflecting beams to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

The writing mechanism 150 irradiates each pixel 36 with a corresponding beam in an ON condition in the multi-beams 20 during a writing time (irradiation time or exposure time) corresponding to each pixel 36 within a maximum irradiation time Ttr of the irradiation time of each of the multi-beams of the shot concerned.

In the example of FIG. 8, the second pixel from the right in the bottom row of the grid 29 concerned is irradiated with the first shot of the beam (1) at coordinates (1, 3) during the time from t=0 to t=maximum irradiation time Ttr, for example. Thereby, the pixel concerned has received beam irradiation of a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation of the shot concerned, while the beam deflection for tracking control is continuously performed by the deflector 208, the writing position (previous writing position) of each beam is shifted to a next writing position (current writing position) of each beam by collectively deflecting the multi-beams 20 by the deflector 209, which is performed in addition to the beam deflection for tracking control. In the example of FIG. 8, when the time becomes t=Ttr, the pixel to be written (writing pixel) is shifted from the second pixel from the right in the bottom row of the grid 29 concerned to the second pixel from the right in the second row from the bottom. Since the XY stage 105 is moving at a fixed speed also during this time period, the tracking operation is continuously performed.

Then, while the tracking control is continued, respective corresponding beams in the ON condition in the multi-beams 20 are applied to shifted writing positions corresponding to the respective beams during a writing time corresponding to each of the respective beams within the maximum irradiation time Ttr of the shot concerned. In the example of FIG. 8, the second pixel from the right in the second row from the bottom of the grid 29 concerned is irradiated with the second shot of the beam (1) at coordinates (1, 3) during the time from t=Ttr to t=2Ttr, for example. The XY stage 105 moves two beam pitches in the −x direction during the time from t=Ttr to t=2Ttr, for example. During this time period, the tracking operation is continuously performed.

In the example of FIG. 8, when the time becomes t=2Ttr, the pixel to be written (writing pixel) is shifted from the second pixel from the right in the second row from the bottom of the grid 29 concerned to the second pixel from the right in the third row from the bottom. Since the XY stage 105 is moving also during this time period, the tracking operation is continuously performed. The second pixel from the right in the third row from the bottom of the grid 29 concerned is irradiated with a beam of the third shot of the beam (1) at coordinates (1, 3) during the time from t=2Ttr to t=3Ttr, for example. Thereby, the pixel concerned has received beam irradiation of a desired irradiation time.

The XY stage 105 moves two beam pitches in the −x direction during the time from t=2Ttr to t=3Ttr, for example. During this time period, the tracking operation is continuously performed. When the time becomes t=3Ttr, the pixel to be written (writing pixel) is shifted from the second pixel from the right in the third row from the bottom of the grid 29 concerned to the second pixel from the right in the fourth row from the bottom by collectively deflecting the multi-beams 20 by the deflector 209. Since the XY stage 105 is moving also during this time period, the tracking operation is continuously performed.

The second pixel from the right in the fourth row from the bottom of the grid 29 concerned is irradiated with a beam of the fourth shot of the beam (1) at coordinates (1, 3) during the time from t=3Ttr to t=4Ttr, for example. Thereby, the pixel concerned has received beam irradiation of a desired irradiation time.

The XY stage 105 moves two beam pitches in the −x direction during the time from t=3Ttr to t=4Ttr, for example. During this time period, the tracking operation is continuously performed. In this manner, writing of the pixels in the second column from the right of the grid 29 has been completed.

In the example of FIG. 8, after emitting a corresponding beam to the writing position of each beam which has been shifted three times from the initial position, the DAC amplifier circuit 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4Ttr, tracking of the grid 29 concerned is cancelled, and the beam is swung back to a new target grid which has been shifted by eight beam pitches in the x direction. Although the beam (1) at the coordinates (1, 3) has been described in the example of FIG. 8, writing is also similarly performed for each grid corresponding to a beam at other coordinates. That is, a beam at coordinates (n, m) completes writing of pixels in the second column from the right of a corresponding grid when the time becomes t=4Ttr. For example, a beam (2) at coordinates (2, 3) completes writing of pixels in the second column from the right of a grid adjacent in the −x direction to the grid 29 concerned for the beam (1) of FIG. 8.

Since writing of the pixels in the second column from the right of each grid has been completed, in a next tracking cycle after resetting the tracking, the deflector 209 performs deflection such that the writing position of each corresponding beam is adjusted (shifted) to the third pixel from the right in the first row from the bottom of each grid. Although the example of FIG. 8 describes writing of pixels in the second column from the right of each grid, it should be understood that writing of pixels in the first column from the right of each grid has been completed by the previous tracking cycle.

As described above, each shot is performed while shifting the irradiation position (the position to be irradiated) pixel by pixel by the deflector 209 in a state such that the relative position of the irradiation region 34 to the target object 101 is controlled by the deflector 208 to be unchanged during the same tracking cycle. Then, after finishing one tracking cycle and returning the tracking position of the irradiation region 34, as shown in the lower part of FIG. 6, the shot position for the first shot is adjusted to the position shifted by one pixel, for example. Then, each shot is performed shifting the irradiation position pixel by pixel by the deflector 209 while performing a next tracking control. By repeating this operation during writing the stripe region 32, the position of the irradiation region 34 is shifted one by one, such as from 34a to 34o, to perform writing of the stripe region concerned.

When writing the target object 101 with the multi-beams 20, as described above, irradiation is performed per pixel sequentially and continuously with multi-beams 20, serving as shot beams, by moving the beam deflection position by the deflector 209 while following the movement of the XY stage 105 during the tracking operation by the deflector 208. It is determined, based on the writing sequence, which beam of multi-beams irradiates which pixel on the target object 101. Then, the region of the beam pitch (x direction) multiplied by the beam pitch (y direction), where the beam pitch is between beams adjacent in the x or y direction of multi-beams on the surface of the target object 101, is configured by a region (sub-pitch region: grid) composed of n×n pixels. For example, when the XY stage 105 moves in the −x direction by the length of beam pitch (x direction) by one tracking operation, as described above, n pixels are written in the y direction by one beam while the irradiation position is shifted. Alternatively, n pixels may be written in the x direction or diagonal direction by one beam while the irradiation position is shifted. Then, by the next tracking operation, another n pixels in the same n×n pixel region are similarly written by a different beam from the one used above. Thus, n pixels are written each time of n times of tracking operations, using a different beam each time, thereby writing all the pixels in one region of n×n pixels. With respect also to other regions each composed of n×n pixels in the irradiation region of multi-beams, the same operation is executed at the same time so as to perform writing similarly.

Next, operations of the writing mechanism 150 of the writing apparatus 100 will be described. The electron beam 200 emitted from the electron gun 201 (emission source) almost perpendicularly (e.g., vertically) illuminates the whole of the shaping aperture array substrate 203 by the illumination lens 202. A plurality of quadrangular holes (openings) are formed in the shaping aperture array substrate 203. The region including all the plurality of holes is irradiated with the electron beam 200. For example, a plurality of quadrangular electron beams (multi-beams) 20a to 20e are formed by letting portions of the electron beam 200, which irradiates the positions of a plurality of holes 22, individually pass through a corresponding hole of the plurality of holes of the shaping aperture array substrate 203. The multi-beams 20a to 20e individually pass through corresponding blankers (first deflector: individual blanking mechanism) of the blanking aperture array mechanism 204. Each blanker deflects (provides blanking deflection) the electron beam 20 which is individually passing.

The multi-beams 20a to 20e having passed through the blanking aperture array mechanism 204 are reduced by the reducing lens 205, and go toward the hole in the center of the limiting aperture substrate 206. At this stage, the electron beam 20 which was deflected by the blanker of the blanking aperture array mechanism 204 deviates (shifts) from the hole in the center of the limiting aperture substrate 206 and is blocked by the limiting aperture substrate 206. On the other hand, the electron beam 20 which was not deflected by the blanker of the blanking aperture array mechanism 204 passes through the hole in the center of the limiting aperture substrate 206 as shown in FIG. 1. Blanking control is provided by ON/OFF of the individual blanking mechanism so as to control ON/OFF of beams. Thus, the limiting aperture substrate 206 blocks each beam which was deflected to be in the OFF state by the individual blanking mechanism. Then, for each beam, one shot beam is formed by a beam which has been made during a period from becoming beam ON to becoming beam OFF and has passed through the limiting aperture substrate 206. The multi-beams 20 having passed through the limiting aperture substrate 206 are focused by the objective lens 207 so as to be a pattern image of a desired reduction ratio. Then, respective beams (the whole of the multi-beams 20) having passed through the limiting aperture substrate 206 are collectively deflected in the same direction by the deflectors 208 and 209 in order to irradiate respective beam irradiation positions on the target object 101. Ideally, the multi-beams 20 irradiating at a time are aligned at pitches obtained by multiplying the arrangement pitch of a plurality of holes of the shaping aperture array substrate 203 by a desired reduction ratio described above.

Figure 9:
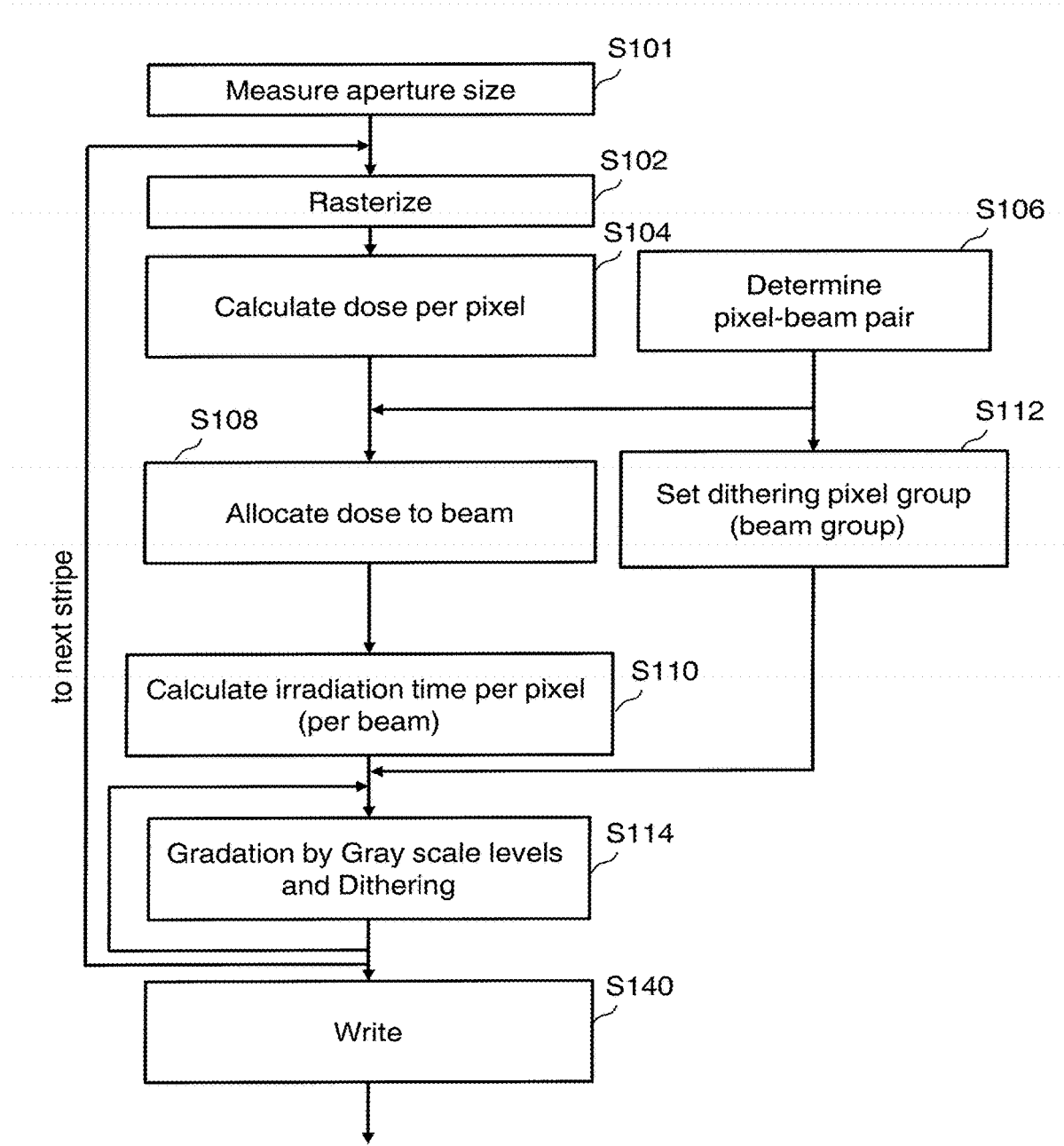
FIG. 9 is a flowchart showing main steps of a writing method according to the first embodiment.

FIG. 9 is a flowchart showing main steps of a writing method according to the first embodiment. In FIG. 9, the writing method of the first embodiment executes a series of steps: a shaping aperture size measuring step (S101), a rasterizing step (S102), a dose per pixel calculation step (S104), a pixel-beam pair determination step (S106), a dose-for-beam allocation step (S108), an irradiation time per pixel (per beam) calculation step (S110), a dithering pixel group (beam group) setting step (S112), gradation by gray scale levels and dithering step (S114), and a writing step (S140).

Figure 10:
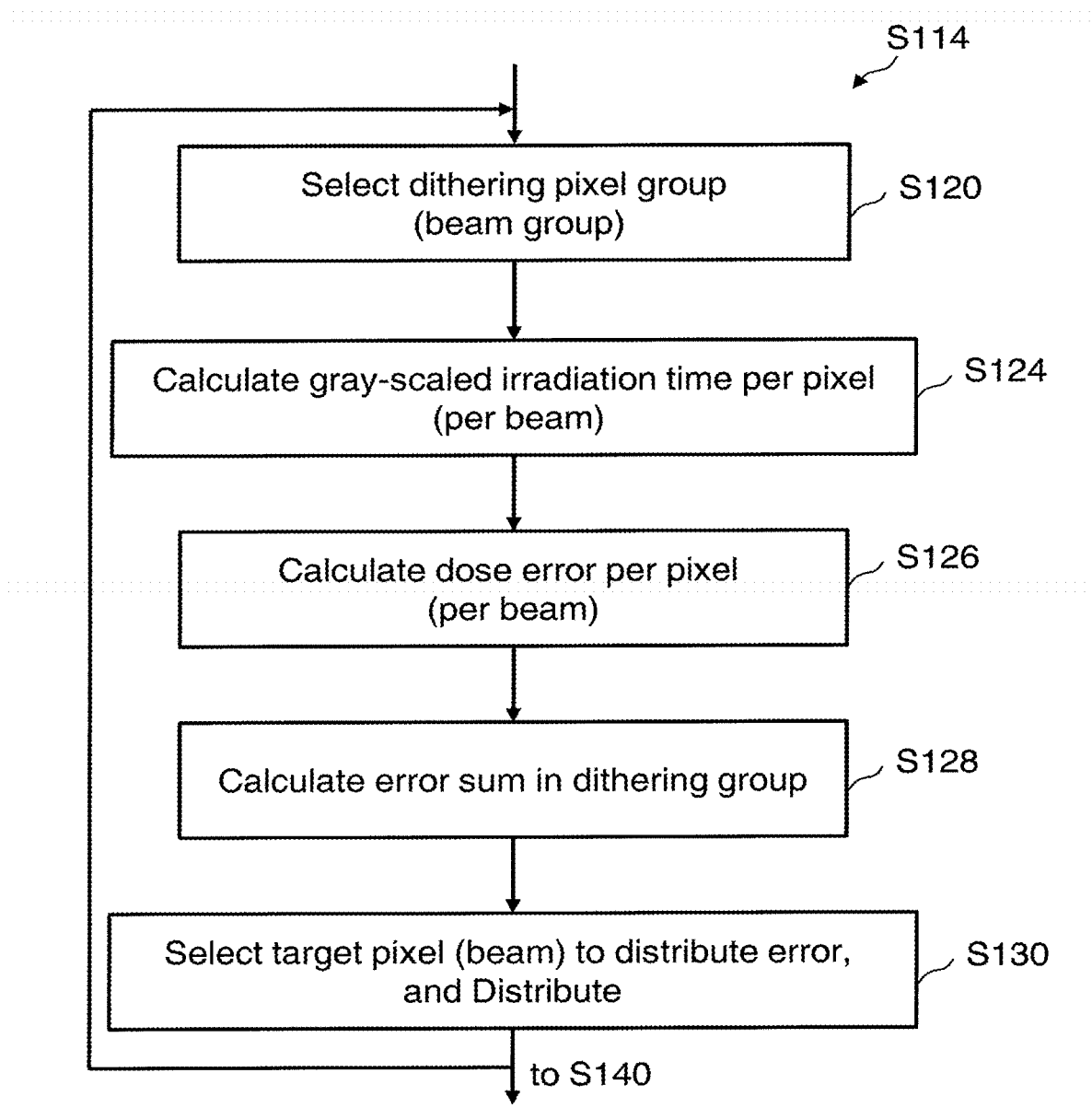
FIG. 10 is a flowchart showing steps in gray-scale gradations and dithering step according to the first embodiment.

FIG. 10 is a flowchart showing steps in gradation by gray scale levels and dithering step according to the first embodiment. In FIG. 10, the gradation by gray scale levels and dithering step (S114) executes, as its contents, a series of steps: a dithering pixel group (beam group) selection step (S120), a gray-scaled irradiation time per pixel (per beam) calculation step (S124), a dose error per pixel (per beam) calculation step (S126), an error sum in dithering group calculation step (S128), and an error distribution target pixel (beam) selecting/distributing step (S130).

In the shaping aperture size measuring step (S101), the size "a" of each aperture 22 formed in the shaping aperture array substrate 203 is measured using a microscope, etc. Although the size "a" of each aperture 22 is ideally the same as each other, some deviation (shifting) may occur between each of the apertures 22 due to degree of processing accuracy. Since the size of each aperture 22 determines the size of each beam of the multi-beams 20, if an error occurs in the size, the dose of an irradiation beam becomes different. Then, in the first embodiment, the irradiation time is set in consideration of even a dose error caused by the size of the aperture 22. However, it is not limited thereto, and if able to process (form) each aperture 22 in a manner such that a dimension error between each of the apertures 22 can be allowable, the present step may be omitted.

In the rasterizing step (S102), the rasterizing unit 50 reads writing data from the storage device 140, and calculates, for each pixel 36, a pattern area density ρ' in the pixel 36 concerned. This processing is performed for each stripe region 32, for example.

In the dose per pixel calculation step (S104), first, the dose D calculation unit 52 virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 µm. The dose D calculation unit 52 reads writing data from the storage device 140, and calculates, for each proximity mesh region, a pattern area density ρ of a pattern arranged in the proximity mesh region concerned.

Next, the dose D calculation unit 52 calculates, for each proximity mesh region, a proximity-effect correction irradiation coefficient $D_p(x)$ (correction dose) for correcting a proximity effect. An unknown proximity-effect correction irradiation coefficient Dp(x) can be defined by a threshold value model for proximity-effect correction, which is the same as the one used in a conventional method where a backscatter coefficient η, a dose threshold value Dth of a threshold value model, a pattern area density ρ, and a distribution function g(x) are used.

Next, the dose D calculation unit 52 calculates, for each pixel 36, an incident dose D(x) with which the pixel 36 concerned is irradiated. The incident dose D(x) can be calculated by multiplying a pre-set base dose $D_{base}$, a proximity effect correction irradiation coefficient $D_p$, and a pattern area density ρ'. The base dose $D_{base}$ can be defined by Dth/(½+η), for example. Thereby, it is possible to obtain an originally desired dose D, for which the proximity effect has been corrected, based on layout of a plurality of figure patterns defined by the writing data.

In the pixel-beam pair determination step (S106), the writing control unit 72 determines, for each pixel, a shot number indicating the order of a shot and a beam identification number (e.g., beam coordinates) indicating which beam of the multi-beams 20 emitted by the shot concerned performs irradiation, based on a pre-set writing sequence, and further determines, for each pixel, a combination (pixel-beam pair) of pixel and beam being a pair.

In the dose-for-beam allocation step (S108), the allocation unit 54 allocates, in order of shot, a dose D of the pixel 36 to be irradiated with the beam concerned, to each beam of the multi-beams 20 of each shot.

In the irradiation time per pixel (per beam) calculation step (S110), the irradiation time t calculation unit 58 calculates an irradiation time t of a beam to the pixel 36 concerned, for each of a plurality of pixels 36 which are obtained by dividing the writing region 30 of the target object 101 and each of which serves as an irradiation unit region per beam of multi-beams. The irradiation time t of each pixel is a value(=irradiation time $t_0$ in design) obtained by dividing the dose D by a current density J of the multi-beams 20 if there is no size error between each of the apertures 22 of the shaping aperture array 203. In the first embodiment, a size error between each of the apertures 22 is taken into consideration. Therefore, the irradiation time t calculation unit 58 calculates, for each pixel 36, an irradiation time t of a beam to the pixel 36 concerned by using the size "$a_0$" of the aperture 22 in design and the size "a" of the aperture 22 actually measured. The irradiation time t can be defined by the following equation (1). The calculation sequence may be a shot sequence and a beam sequence instead of the arrangement sequence of the pixels 36. Thereby, the irradiation time t can be calculated for each beam.

$$t=(a_0^2/a^2) \cdot D/J = (a_0^2/a^2) \cdot t_0 \tag{1}$$

In the dithering pixel group (beam group) setting step (S112), the setting unit 56 sets a dithering pixel group (beam group).

Figure 11:
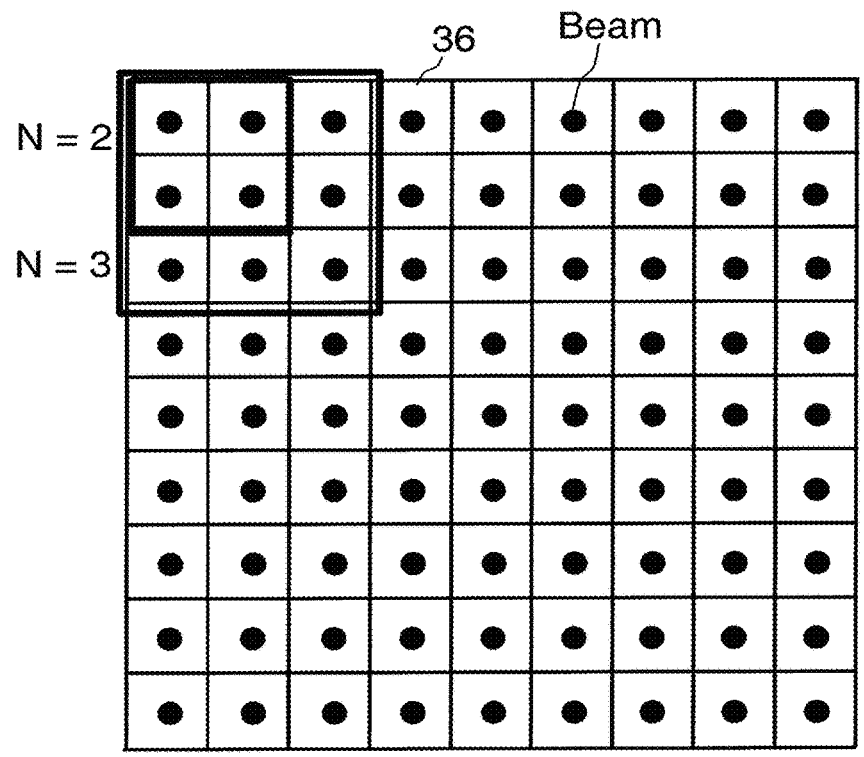
FIG. 11 shows an example of a dithering pixel group according to the first embodiment.

FIG. 11 shows an example of a dithering pixel group according to the first embodiment. FIG. 11 shows a part of the stripe region 32 being a target of data processing. As shown in FIG. 11, the dithering pixel group is composed of a plurality of adjacent pixels 36. In the example of FIG. 11, the group is composed of 2×2 pixels 36, for example. Alternatively, it is composed of 3×3 pixels 36. Although, by configuring the dithering pixel group by $2^{n'}$ pixels 36, the resolution can be increased from n-bit gray-scaled irradiation time data to (n+n') -bit data as described later, it is preferable to configure the group by n'×n' pixels 36 from the ease of grouping. The value of n' may be set previously.

In the gradation by gray scale levels and dithering step (S114), gradation by gray scale levels and errors associated with the gradation by gray scale levels are corrected using the irradiation time t acquired for each pixel. It will be specifically described.

In the dithering pixel group (beam group) selection step (S120), the selection unit 60 selects a dithering pixel group (beam group) being a current target, from a plurality of dithering pixel groups (beam groups) having been set.

Figure 12:
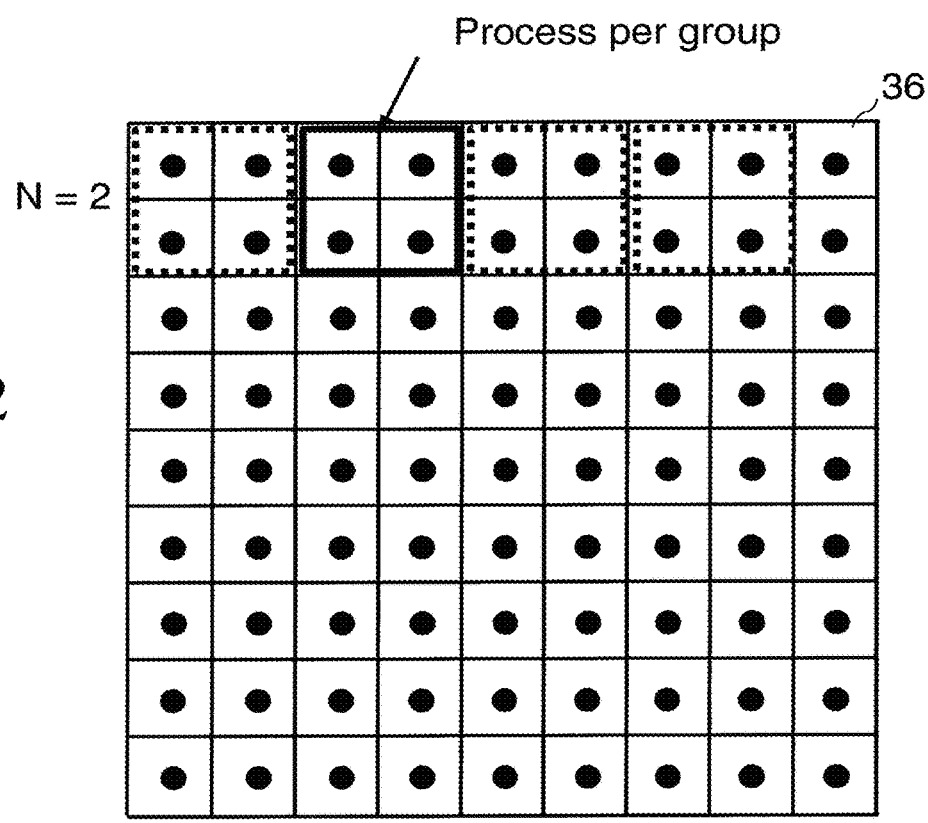
FIG. 12 shows an example of selection of a dithering pixel group according to the first embodiment.

FIG. 12 shows an example of selection of a dithering pixel group according to the first embodiment. FIG. 12 shows a part of the stripe region 32 which is a target of data processing. Referring to the example of FIG. 12, the dithering pixel group composed of 2×2 pixels 36 will be explained. In order to perform dithering, a dithering pixel group of 2×2 pixels 36 second from the left is selected, for example, in the case of FIG. 12.

In the gray-scaled irradiation time per pixel (per beam) calculation step (S124), the gray-scale value calculation unit 62 calculates, for each pixel 36, a gray-scale value N, being an integer obtained by gradation by gray scale levels, by dividing an irradiation time t by a quantization unit δ. The remainder generated by dividing the irradiation time t by the quantization unit δ is rounded down. The gray-scale value N can be defined by the following equation (2). The calculation sequence may be a shot sequence and a beam sequence instead of the arrangement sequence of the pixels 36. Thereby, the gray-scale value N can be calculated for each beam. The quantization unit δ is set within the range where Ttr≤L·δ is satisfied by the relation between a maximum irradiation time Ttr which is set by one-time shot of the multi-beams 20, and a maximum gray-scale value L(=$2^n$−1) which can be defined by n-bit gray-scaled irradiation time data.

$$N=\text{floor}(t/δ) \tag{2}$$

In the dose error per pixel (per beam) calculation step (S126), the dose error ΔD calculation unit 64 calculates, for each dithering pixel group, a dose error ΔD of each pixel 36 in the group concerned by using a gray-scale value N and an irradiation time t for each pixel 36 in the group concerned. The dose error ΔD can be defined by following equations (3-1) and (3-2) using a gray-scaled irradiation time error Δt.

$$ΔD=Δt \cdot J \tag{3-1}$$

$$Δt=N \cdot δ − t \tag{3-2}$$

In here, since the current density of the electron beam 200 to irradiate a shaping aperture is not uniform but has distribution, the current density J becomes a different value depending on the beam.

In the error sum in dithering group calculation step (S128), the dose error sum $ΔD_{sum}$ calculation unit 66 calculates, for each group, a sum $ΔD_{sum}$ of dose error ΔD of each pixel 36 in the group concerned. The dose error sum $ΔD_{sum}$ can be defined by the following equation (4).

$$ΔD_{sum}=ΣΔD \tag{4}$$

In here, $ΔD_{sum}$ is not an error that occurs due to gradation, by gray scale levels, of dose, but an error of dose that occurs due to gradation, by gray scale levels, of irradiation time.

In the error distribution target pixel (beam) selecting/distributing step (S130), the gray-scale value correction unit 68 corrects, for each group composed of adjacent pixels 36, dose errors ΔD each caused by gradation, by gray scale levels, of irradiation time which occur in the adjacent pixels 36 in the group concerned, by increasing/decreasing the gray-scale value N of at least one pixel 36 in the group concerned by 1, in other words by distributing dose errors. The gray-scale value correction unit 68 increases or decreases, for each group, the gray-scale value N of at least one pixel 36 in the group concerned by 1, based on a dose error ΔD of each pixel 36. Specifically, the gray-scale value correction unit 68 increases or decreases, for each group, the gray-scale value N of at least one pixel 36 in the group concerned by 1 so that the sum $\Delta D_{sum}$ of dose error may be the minimum.

FIGS. 13A to 13C are for explaining an example of resolution enhancement by dithering according to the first embodiment. FIGS. 13A to 13C illustrate the case where a dithering pixel group is composed of 2×2 pixels 36, and a line pattern in the x direction is written. FIG. 13A shows an example of a dose to be distributed to each pixel based on a result of the distributing step (S130). The white frame line represents an outline of a pattern of 400 nm wide (in the x direction) and 40 nm long (in the y direction). Here, the case is shown where the value of dose in the pattern region is uniformly 1.005, and the dose error ΔD of each pixel is 0.005. g1 is one of the dithering groups, and composed of 2×2 pixels each being 10 nm wide. Other dithering groups (not shown) in addition to g1 fill the range of FIGS. 13A to 13C, and a 0.01 dose is distributed to two pixels_in a dithering group in the pattern. Since the dose and dose error are 0 (zero) with respect to dithering groups which are not in the pattern, no dose is distributed to them. FIG. 13B shows how to distribute the dose to each pixel in a dithering group. The dose is distributed with increasing the gray-scale value N of the exposure time by 1, to each of the pixels denoted by 1, 2, 3, and 4 in order, for each dithering gray-scale value. FIG. 13C shows a result of simulation of displacement of the pattern edge position (y direction) in the case of performing dithering of a line pattern in the x direction. The dimension of a resist pattern is calculated from a dose distribution where a threshold value dose model is used as a resist development model. The calculation is performed while representing aberration and beam blur in resist development with a Gaussian function with a half-width of 20 nm. With respect to a dithering pixel group including a pixel at one edge in the y direction of a line pattern, when not performing gray-scale value correction (not performing dithering) of any pixel 36 in the dithering pixel group, the pattern edge position in the example of FIG. 13A is 239.5 nm which is indicated by 0 (zero) in the abscissa axis representing "dithering gray-scale value" of FIG. 13C. On the other hand, in the case of increasing, by 1, each of the gray-scale values of all the pixels 36 in the dithering pixel group concerned, the pattern edge position in the example of FIG. 13A is about 239.84 nm which is indicated by 4 in the abscissa axis representing "dithering gray-scale value" of FIG. 13C. Thus, since intrinsically only one gray-scale value can be set for each of the pixels 36, if it is tried to control the dose per pixel 36, the value which comes after 239.5 nm is about 239.84 nm.

By contrast, in the case of increasing the gray-scale value of one pixel 36 in the dithering pixel group concerned by 1, the pattern edge position of the example of FIG. 13A is about 239.57 nm which is indicated by 1 in the abscissa axis representing "dithering gray-scale value" of FIG. 13C. In the case of increasing, by 1, each of the gray-scale values of two pixels 36 in the dithering pixel group concerned, the pattern edge position in the example of FIG. 13A is about 239.67 nm which is indicated by 2 in the abscissa axis representing "dithering gray-scale value" of FIG. 13C. In the case of increasing, by 1, each of the gray-scale values of three pixels 36 in the dithering pixel group concerned, the pattern edge position in the example of FIG. 13A is about 239.74 nm which is indicated by 3 in the abscissa axis representing "dithering gray-scale value" of FIG. 13C. From the above result, compared with the case of controlling the dose per pixel 36, dose control resolution can be increased to be four times($=2^2$). In other words, in the case of configuring a dithering pixel group by 2×2 pixels 36, it is possible, by performing dithering, to control the dose (edge position, pattern dimension CD) per ¼ gray-scale level. This is equivalent to increasing the accuracy of gray-scaled irradiation time data from n-bit to (n+2) bit.

Figure 14A:
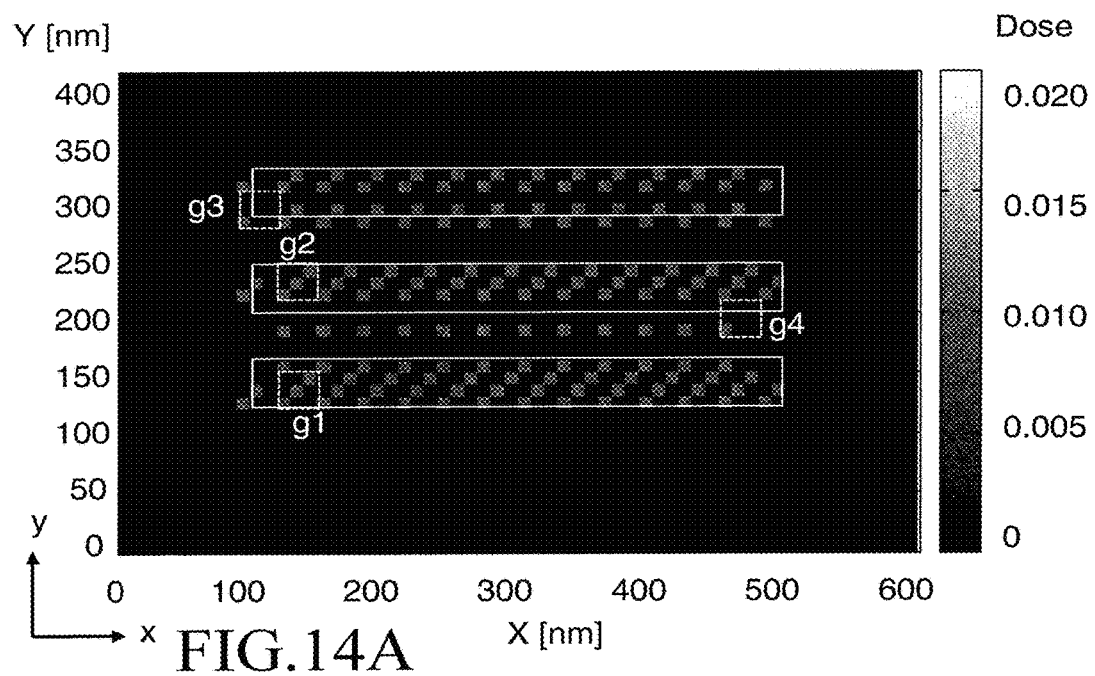
FIGS. 14A to 14C are for explaining an example of resolution enhancement by dithering according to the first embodiment.
Figure 14B:
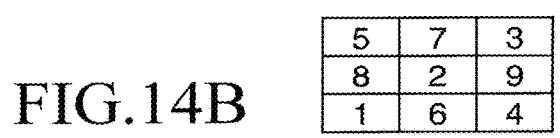
Figure 14C:
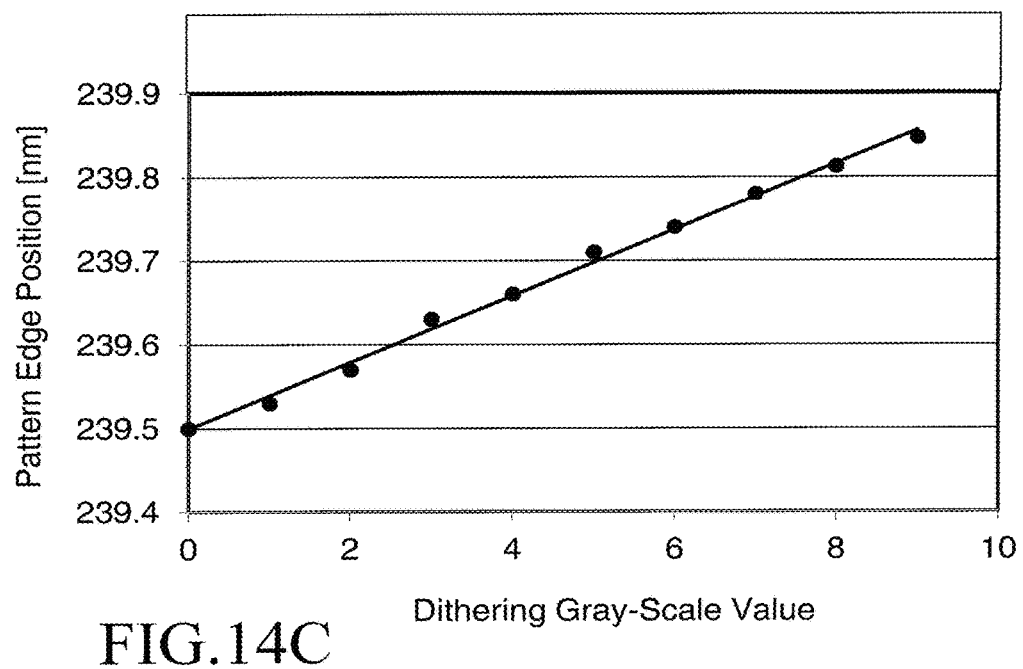

FIGS. 14A to 14C are for explaining an example of resolution enhancement by dithering according to the first embodiment. The example of FIG. 14A illustrates the case where a dithering pixel group is composed of 3×3 pixels 36, and a line pattern in the x direction is written. Here, the case is shown where the value of dose in the pattern region is uniformly 1.003, and the dose error ΔD of each pixel is 0.003. In the example of FIG. 14A, the boundary of the dithering group does not match with the boundary of the line pattern. Therefore, the number of pixels to which the dose is distributed differs for each dithering group, depending on the number of pixels included in the pattern. With respect to the dithering groups g1 and g2 in the pattern regions, a 0.01 dose is distributed to three pixels in the group. With respect to the dithering groups g3 and g4 extending beyond the pattern boundary, a 0.01 dose is distributed to one pixel. FIG. 14B shows how to distribute the dose to each pixel in a dithering group. The dose is distributed, per dithering gray-scale value, to each of the pixels denoted by 1 to 9. FIG. 14C shows a result of simulation of displacement of the pattern edge position (y direction) in the case of performing dithering of a line pattern in the x direction. With respect to a dithering pixel group including a pixel at one edge in the y direction of a line pattern, when not performing gray-scale value correction (not performing dithering) of any pixel 36 in the dithering pixel group, the pattern edge position in the example of FIG. 14A is 239.5 nm which is indicated by 0 (zero) in the abscissa axis representing "dithering gray-scale value" of FIG. 14C. On the other hand, in the case of increasing, by 1, each of the gray-scale values of all the pixels 36 in the dithering pixel group concerned, the pattern edge position in the example of FIG. 14A is about 239.85 nm which is indicated by 9 in the abscissa axis representing "dithering gray-scale value" of FIG. 14C, and thus, it is possible to obtain almost the same value as that shown in FIG. 13C.

By contrast, in the case of increasing the gray-scale value of one pixel 36 in the dithering pixel group concerned by 1, the pattern edge position of the example of FIG. 14A is about 239.52 nm which is indicated by 1 in the abscissa axis representing "dithering gray-scale value" of FIG. 14C. In the case of increasing, by 1, each of the gray-scale values of two pixels 36 in the dithering pixel group concerned, the pattern edge position in the example of FIG. 14A is about 239.57 nm which is indicated by 2 in the abscissa axis representing "dithering gray-scale value" of FIG. 14C. In the case of increasing, by 1, each of the gray-scale values of three pixels 36 in the dithering pixel group concerned, the pattern edge position in the example of FIG. 14A is about 239.61 nm which is indicated by 3 in the abscissa axis representing "dithering gray-scale value" of FIG. 14C. In the case of increasing, by 1, each of the gray-scale values of four pixels 36 in the dithering pixel group concerned, the pattern edge position in the example of FIG. 14A is about 239.64 nm which is indicated by 4 in the abscissa axis representing "dithering gray-scale value" of FIG. 14C. In the case of increasing, by 1, each of the gray-scale values of five pixels 36 in the dithering pixel group concerned, the pattern edge position in the example of FIG. 14A is about 239.68 nm which is indicated by 5 in the abscissa axis representing "dithering gray-scale value" of FIG. 14C. In the case of increasing, by 1, each of the gray-scale values of six pixels 36 in the dithering pixel group concerned, the pattern edge position in the example of FIG. 14A is about 239.71 nm which is indicated by 6 in the abscissa axis representing "dithering gray-scale value" of FIG. 14C. In the case of increasing, by 1, each of the gray-scale values of seven pixels 36 in the dithering pixel group concerned, the pattern edge position in the example of FIG. 14A is about 239.76 nm which is indicated by 7 in the abscissa axis representing "dithering gray-scale value" of FIG. 14C. In the case of increasing, by 1, each of the gray-scale values of eight pixels 36 in the dithering pixel group concerned, the pattern edge position in the example of FIG. 14A is about 239.79 nm which is indicated by 8 in the abscissa axis representing "dithering gray-scale value" of FIG. 14C. From the above result, compared with the case of controlling the dose per pixel 36, dose control resolution can be increased to be nine times≈$2^3$. In other words, in the case of configuring a dithering pixel group by 3×3 pixels 36, it is possible, by performing dithering, to control the dose (edge position, pattern dimension CD) per ⅑ gray-scale level. This is equivalent to increasing the accuracy of gray-scaled irradiation time data from n-bit to (n+3) bit.

Then, the gray-scale value correction unit 68 increases or decreases, for each group, the gray-scale value N of at least one pixel 36 in the group concerned by 1 so that the dose error sum $\Delta D_{sum}$ may be the minimum. In the example described above, since the digits after the decimal point have been rounded down in performing gradation by gray scale levels, the dose error sum $\Delta D_{sum}$ becomes negative. In other words, the dose in the group is insufficient. In such a case, therefore, an adjustment is made by increasing, by 1, the gray-scale value N of at least one pixel 36 in the group concerned. If the digits after the decimal point have been rounded up in performing gradation by gray scale levels, an adjustment is made by decreasing, by 1, the gray-scale value N of at least one pixel 36 in the group concerned. If rounding-up and rounding-down operations are intermingled, such as rounding-off digits after the decimal point, in performing the gradation by gray scale levels, an adjustment is made by increasing or decreasing, by 1, the gray-scale value N of at least one pixel 36 in the group concerned. For example, when the dose error sum $\Delta D_{sum}$ is −0.02 AU (address unit) and the dose of 0.1 AU can be increased or decreased per gray-scale level, it is possible to perform correction per 0.1/4=0.025 AU in the dithering pixel group composed of 2×2 pixels 36. Therefore, in such a case, the dose error sum $\Delta D_{sum}$ can be reduced to −0.02+0.025=0.005 AU in the dithering pixel group concerned by increasing, by 1, the gray-scale value of one pixel in the dithering pixel group concerned. For example, if the gray-scale values N of 2×2 pixels 36 are 500, 500, 500, and 500, the dose error sum $\Delta D_{sum}$ in the dithering pixel group concerned can be reduced by correcting the values to 500, 501, 500, and 500, for example.

The gradation by gray scale levels and dithering step (S114) is repeated for all the dithering pixel groups in a target stripe region 32. As described above, compared with the case of controlling the dose per pixel 36, errors of gradation by gray scale levels can be reduced by controlling the dose per dithering pixel group in units of dose control. With respect to the pixel 36 whose gray-scale value N is increased or decreased by 1 in a dithering pixel group, any one of the pixels 36 in the group may be selected as long as the size "a" of the aperture 22 used for shaping a beam to irradiate a corresponding pixel 36 is the design size $a_0$. If the size "a" has a distribution, since the influence on the dose varies depending on the pixel, the optimal pixel combination may be selected according to the distribution.

Dose errors associated with gradation, by gray scale levels, of all the pixels 36 can be reduced by gray-scale value correction by performing dithering described above for all the pixels 36 in the writing region (here, the target stripe region 32), irrespective of whether or not a pattern is arranged.

In the writing step (S140), the writing mechanism 150 writes a pattern on the target object 101 with the multi-beams 20, based on the gray-scale value N of each pixel 36 in each group for which dose errors (here, dose error sum $\Delta D_{sum}$) caused by gradation by gray scale levels have been corrected. The specific way of writing process is what has been described above. Since, when writing, irradiation of multi-beams 20 is performed while shifting a pixel to be irradiated in order of shot, adjacent pixels 36 are not necessarily exposed consecutively, which is what has been described above.

Writing process is sequentially advanced by performing data processing (S102 to S114) of the (m+1)th stripe region 32 in parallel to the writing step (S140) of the m-th stripe region 32.

As described above, according to the first embodiment, a gray-scale level error of the irradiation time t by gradation by gray scale levels can be corrected in multi-beam writing. Therefore, dimensional deviation of line width critical dimension (CD) of a pattern resulting from a gray-scale level error by gradation by gray scale levels can be corrected. Accordingly, writing with great precision can be achieved.

Second Embodiment

In a second embodiment, there will be described a configuration for further correcting an irradiation position when the irradiation position of each beam of the multi-beams 20 is displaced (shifted) from a design position.

Figure 15:
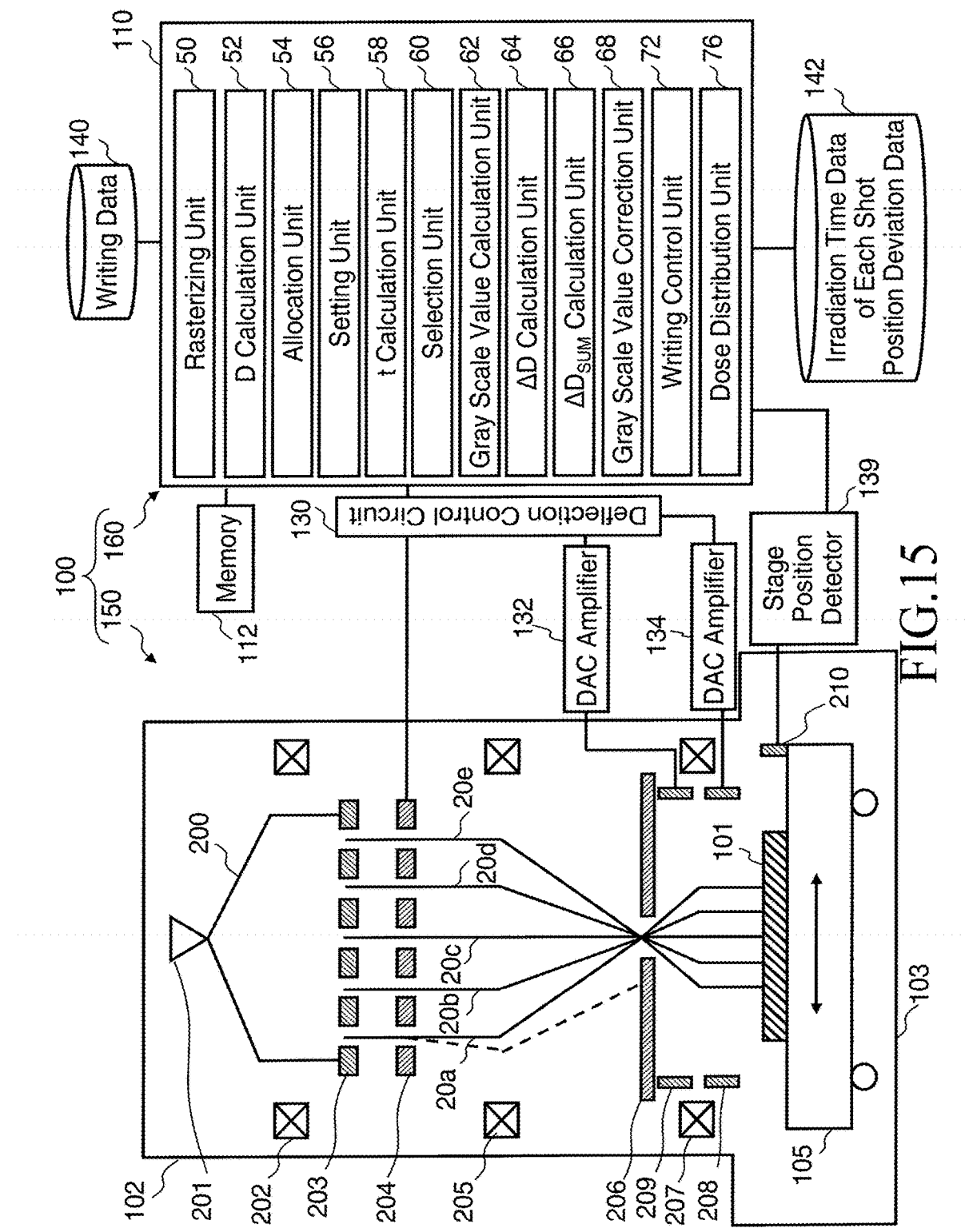
FIG. 15 is a conceptual diagram showing a configuration of a writing apparatus according to a second embodiment.

FIG. 15 is a conceptual diagram showing a configuration of a writing apparatus according to the second embodiment. FIG. 15 is the same as that FIG. 1 except that a dose distribution unit 76 is added in the control computer 110.

Each of the " . . . units" such as the rasterizing unit 50, the dose D calculation unit 52, the allocation unit 54, the setting unit 56, the irradiation time t calculation unit 58, the selection unit 60, the gray-scale value calculation unit 62, the dose error $\Delta D$ calculation unit 64, the dose error sum $\Delta D_{sum}$ calculation unit 66, the gray-scale value correction unit 68, the writing control unit 72, and the dose distribution unit 76 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Data which is input and output to/from the rasterizing unit 50, the dose D calculation unit 52, the allocation unit 54, the setting unit 56, the irradiation time t calculation unit 58, the selection unit 60, the gray-scale value calculation unit 62, the dose error ΔD calculation unit 64, the dose error sum $\Delta D_{sum}$ calculation unit 66, the gray-scale value correction unit 68, the writing control unit 72, and the dose distribution unit 76, and data being operated are stored in the memory 112 each time.

Figure 16:
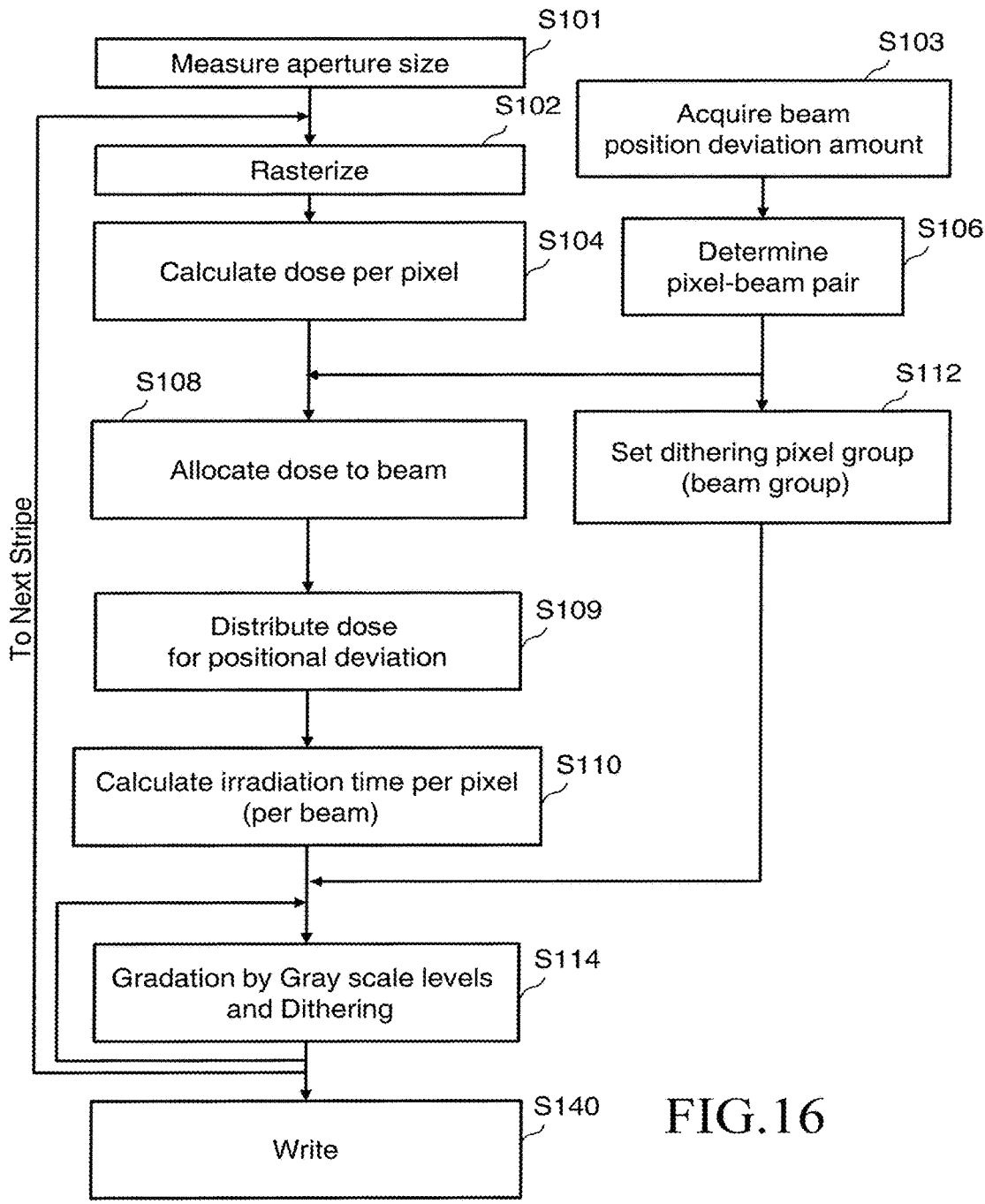
FIG. 16 is a flowchart showing main steps of a writing method according to the second embodiment.

FIG. 16 is a flowchart showing main steps of a writing method according to the second embodiment. FIG. 16 is the same as FIG. 9 except that a beam position deviation amount acquisition step (S103) is added before the pixel-beam pair determination step (S106), and a dose-distribution for positional-deviation step (S109) is added between the dose-for-beam allocation step (S108) and the irradiation time per pixel (per beam) calculation step (S110). The content of the second embodiment is the same as that of the first embodiment except what is particularly described below.

The contents of the shaping aperture size measuring step (S101) and the rasterizing step (S102) are the same as those of the first embodiment.

In the beam position deviation amount acquisition step (S103), before carrying out the writing processing, the positional deviation of the beam in each pixel, caused by irradiation of multi-beams on the surface of the target object 101, is measured in advance. A substrate for measurement with applied resist, which is not shown, is placed on the XY stage 105 to be irradiated by multi-beams 20, and then, its irradiation position is measured. For example, along with the writing sequence, writing is performed pixel by pixel, or several pixels by several pixels, which are mutually separated to the extent causing no measurement problem, and then, the beam irradiation position of a pixel on the measurement substrate is measured using a position measurement device, for example. The positional deviation amount of each pixel can be measured by obtaining a difference between a design position and a measured position. This operation is repeated to measure beam positional deviation amounts of all the pixels. Obtained positional deviation data is input from the outside, and stored in the storage device 142.

The contents of the dose per pixel calculation step (S104), the pixel-beam pair determination step (S106), and the dose-for-beam allocation step (S108) are the same as those of the first embodiment.

In the dose-distribution for positional-deviation step (S109), the dose distribution unit 76 (distribution unit) distributes, for each pixel 36, at least a part of the dose of the pixel 36 concerned to peripheral pixels according to the amount of position deviation of the beam associated with irradiation to the pixel 36 concerned.

FIGS. 17A and 17B illustrate an example of a method of correcting a positional deviation according to the second embodiment. FIG. 17A shows the case where a beam "a'" irradiating the pixel 36 at coordinates (x, y) deviates in the +x and +y directions. In order to correct the deviated position of the pattern formed by the beam "a'" with such positional deviation to the position corresponding to the pixel at coordinates (x, y) as shown in FIG. 17B, the correction can be accomplished by distributing the dose amount of the deviated position to a pixel located opposite to the direction of the deviated peripheral pixels. In the example of FIG. 17A, the dose amount of the deviated position having been displaced (shifted) to the pixel at coordinates (x, y+1) should be distributed to the pixel at coordinates (x, y−1). The dose amount of the deviated position having been displaced to the pixel at coordinates (x+1, y) should be distributed to the pixel at coordinates (x−1, y). The dose amount of the deviated position having been displaced to the pixel at coordinates (x+1, y+1) should be distributed to the pixel at coordinates (x−1, y−1). Therefore, the dose distribution unit 76 first calculates a distribution amount (beam modulation rate) for distributing a dose to a beam for at least one of the peripheral pixels in proportion to a beam positional deviation amount.

The dose distribution unit 76 calculates a modulation rate of a beam to a target pixel and a modulation rate of a beam to at least one pixel at the periphery of the pixel concerned, in proportion to the rate of the area displaced due to positional deviation of a beam to the pixel concerned. Specifically, for each peripheral pixel to which a part of a beam is overlapped due to beam deviation, the ratio obtained by dividing the area of a deviated area (area of an overlapping beam portion) by the area of the beam is calculated as an amount of distribution (distribution dose) to a pixel located opposite to the overlapping pixel.

In the case of FIG. 17A, the area ratio of the portion shifted (displaced) to the pixel at coordinates (x, y+1) can be calculated by ("beam size in x direction"−"deviation amount in x direction")בdeviation amount in y direction"/("beam size in x direction"ב"beam size in y direction"). Therefore, a distribution amount (distribution dose) A to be distributed for correction to the pixel at coordinates (x, y−1) can be calculated by ("beam size in x direction"−"deviation amount in x direction") ב"deviation amount in y direction"/("beam size in x direction"ב"beam size in y direction")×D(x,y).

Also, in the case of FIG. 17A, the area ratio of the portion shifted (displaced) to the pixel at coordinates (x+1, y+1) can be calculated by "deviation amount in x direction"ב"deviation amount in y direction"/("beam size in x direction"ב"beam size in y direction"). Therefore, a distribution amount (distribution dose) B to be distributed for correction to the pixel at coordinates (x−1, y−1) can be calculated by "deviation amount in x direction"ב"deviation amount in y direction"/("beam size in x direction"ב"beam size in y direction")×D(x,y).

Also, in the case of FIG. 17A, the area ratio of the portion shifted (displaced) to the pixel at coordinates (x+1, y) can be calculated by "deviation amount in x direction"×("beam size in y direction"−"deviation amount in y direction"/("beam size in x direction"ב"beam size in y direction"). Therefore, a distribution amount (distribution dose) C to be distributed for correction to the pixel at coordinates (x−1, y) can be calculated by "deviation amount in x direction"×("beam size in y direction"−"deviation amount in y direction"/("beam size in x direction"ב"beam size in y direction")×D(x,y).

As a result, a new dose D' to the pixel at coordinates (x, y), which remains without being distributed, can be calculated by the original D(x,y)−A−B−C.

Next, the dose distribution unit 76 distributes each calculated distribution dose to a corresponding peripheral pixel.

In the irradiation time per pixel (per beam) calculation step (S110), the irradiation time t calculation unit 58 calculates, for each pixel 36, the irradiation time t by using the dose D' of each pixel 36 which has been corrected by distributing at least a part of the dose. The other contents are the same as those in the first embodiment.

The contents of each step after the dithering pixel group (beam group) setting step (S112) are the same as those in the first embodiment.

Figure 18A:
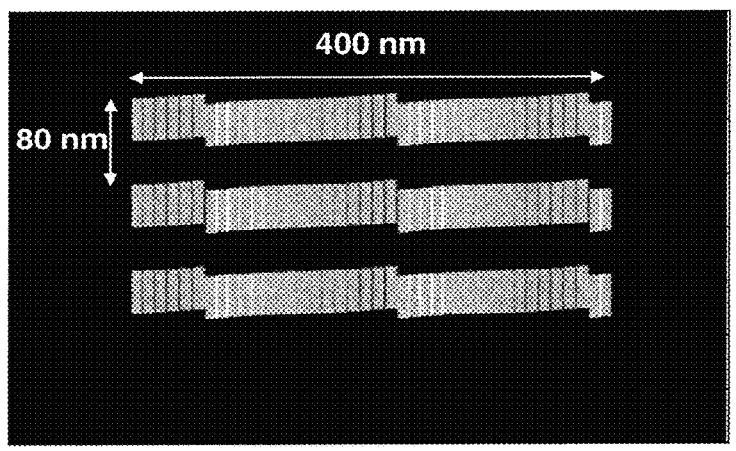
FIGS. 18A to 18C show examples of pattern shapes and examples of pattern edge positions with respect to beam position deviation correction according to the second embodiment.
Figure 18B:
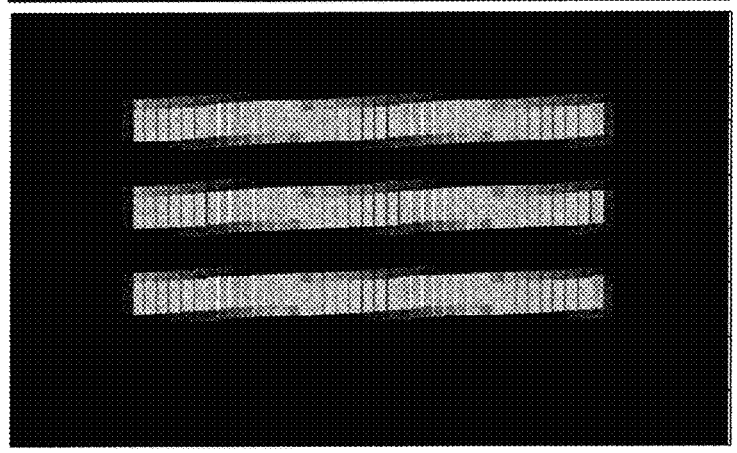
Figure 18C:
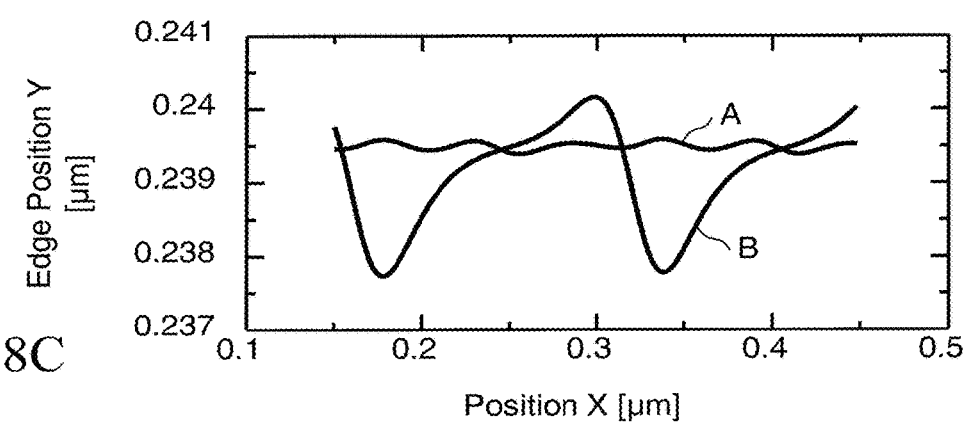

FIGS. 18A to 18C show examples of pattern shapes and examples of pattern edge positions with respect to beam position deviation correction according to the second embodiment. Line patterns each having a 40 nm width in the x direction are shown in the figures. FIG. 18A shows a simulation result of a dose distribution formed when no beam position deviation correction is performed. On the other hand, FIG. 18B shows a simulation result of a dose distribution formed when beam position deviation correction is performed. FIG. 18C shows a simulation result of change of one of the edge positions in the y direction of the line pattern. The edge position of a pattern formed after resist development is calculated from the contour line of distribution obtained by performing a Gaussian convolution integral of half-width of 20 nm on the dose distributions of FIGS. 18A and 18B. When not performing a beam position deviation correction, as shown in FIG. 18A and the graph B of FIG. 18C, one of the edge positions in the y direction of the line pattern shifts largely. On the other hand, when performing a beam position deviation correction, as shown in FIG. 18B and the graph A of FIG. 18C, deviation of one of the edge positions in the y direction of the line pattern is corrected.

As described above, according to the second embodiment, it is possible to correct in multi-beam writing a position deviation of the irradiation position of the multi-beams 20 occurring in the writing mechanism 150 in addition to correcting errors of gradation, by gray scale levels, of the irradiation time t. Accordingly, writing with great precision can be achieved.

In the embodiments described above, there has been described the case where no multiple writing is performed, or even when multiple writing is performed, a correction of gradation by gray scale levels by dithering processing is completed within the same pass (writing processing) of the multiple writing. However, it is not limited thereto, and a correction of gradation by gray scale levels may be performed across a plurality of passes in multiple writing.

FIGS. 19A to 19C show examples of performing a correction of gradation by gray scale levels by dithering processing in the case of multiple writing according to the first and second embodiments. FIGS. 19A to 19C show the case of multiple writing of the multiplicity 4 (four passes). FIG. 19A shows examples of gray-scale values of 2×2 pixels 36 indicated by pixels (1) to (4) configuring a dithering pixel group at each general pass of multiple writing where no correction of gradation by gray scale levels by dithering processing is performed. In the example of FIG. 19A, the gray-scale value of each of 2×2 pixels 36 in each of the first to fourth passes is 7. When the method of the first embodiment or the second embodiment is applied to the multiple writing shown in the example of FIG. 19A, a correction of gradation by gray scale levels by dithering processing may be performed only in the first pass of the four passes as shown in FIG. 19B. In FIG. 19B, the correction of gradation by gray scale levels by dithering processing is performed by increasing, by 1, the gray-scale values of the pixels (1) and (3) in the first pass. Alternatively, as shown in FIG. 19C, the correction of gradation by gray scale levels by dithering processing may be sharingly performed among a plurality of passes in the four passes. In FIG. 19C, by increasing the gray-scale value of the pixel (1) of the first pass by 1, and the gray-scale value of the pixel (3) of the second pass by 1, consequently, the same correction of gradation by gray scale levels by dithering processing as that of FIG. 19B is performed. Thus, in the case of multiple writing, the correction of gradation by gray scale levels by dithering processing may be sharingly performed by a plurality of passes.

Embodiments have been explained referring to specific examples described above. However, the present invention is not limited to these specific examples.

While the case of inputting a 10-bit control signal into each control circuit 41 has been described above, the number of bits may be suitably set. For example, a 2-bit (or 3 to 9 bit) control signal may be used. Alternatively, a control signal of 11-bits or more may be used. Moreover, although the dithering group has one hierarchy in the above examples, it is also preferable to have two hierarchies one of which is a subgroup composed of a plurality of dithering groups. The error of the dose sum can be further reduced by distributing a dose to a part of a subgroup, based on a dose sum error after dithering of each group.

While the apparatus configuration, control method, and the like not directly necessary for explaining the present invention are not described, some or all of them can be selectively used case-by-case basis. For example, although description of the configuration of the control circuit for controlling the writing apparatus 100 is omitted, it should be understood that some or all of the configuration of the control circuit can be selected and used appropriately when necessary.

In addition, any other multi charged particle beam writing apparatus, and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
   an irradiation time calculation circuit configured to calculate an irradiation time of a beam to each pixel, for the each pixel of a plurality of pixels which are obtained by dividing a writing region of a target object and each of which serves as an irradiation unit region per beam of multi charged particle beams;
   a gray-scale value calculation circuit configured to calculate, for the each pixel, a gray-scale value of gradation by gray scale levels by dividing the irradiation time by a quantization unit;
   a gray-scale value correction circuit configured to correct, for each group of a plurality of groups each composed of adjacent pixels, dose errors each caused by the gradation, by gray scale levels, of the irradiation time, said dose errors occurring in the adjacent pixels having the gray-scale value of finite value in a group concerned in the plurality of groups, by performing one of increasing and decreasing the gray-scale value of at least one pixel of the adjacent pixels having the gray-scale value of finite value in the group concerned by 1; and
   a writing mechanism configured to include a shaping aperture array substrate which forms the multi charged particle beams, a deflector which deflects the multi charged particle beams, and a stage on which the target object is placed, and to write a pattern on the target object with the multi charged particle beams, based on a gray-scale value of the each pixel in the each group for which the dose errors each caused by the gradation by gray scale levels have been corrected.

2. The apparatus according to claim 1, further comprising:
a dose error calculation circuit configured to calculate, for the each group, a dose error of each pixel in the each group by using the gray-scale value and the irradiation time for the each pixel in the each group,
wherein the gray-scale value correction circuit performs one of increasing and decreasing the gray-scale value of at least one pixel in the each group by 1, for the each group, based on the dose error of the each pixel.

3. The apparatus according to claim 2, further comprising:
a dose error sum calculation circuit configured to calculate, for the each group, a sum of the dose error of the each pixel in the each group,
wherein the gray-scale value correction circuit performs one of increasing and decreasing the gray-scale value of the at least one pixel in the each group by 1, for the each group, so that the sum of the dose error becomes minimum.

4. The apparatus according to claim 1, further comprising:
a distribution circuit configured to distribute, for the each pixel, at least a part of a dose of the each pixel to a peripheral pixel according to a position deviation amount of a beam associated with beam irradiation to the each pixel,
wherein the irradiation time calculation circuit calculates, for the each pixel, the irradiation time by using a dose of the each pixel which has been corrected by distributing the at least the part of the dose.

5. The apparatus according to claim 1, further comprising:
a setting unit configured to set the plurality of groups each composed of a plurality of the adjacent pixels.

6. The apparatus according to claim 5, wherein the each of the plurality of groups is composed of n'×n' pixels.

7. The apparatus according to claim 5, wherein the each of the plurality of groups is composed of 2×2 pixels.

8. The apparatus according to claim 5, wherein the each of the plurality of groups is composed of 3×3 pixels.

9. The apparatus according to claim 6, wherein the gray-scale value correction circuit corrects the dose error occurring in the n'×n' pixels, by performing one of increasing and decreasing a gray-scale value of at least one pixel in the n'×n' pixels by 1.

10. A multi charged particle beam writing method comprising:
calculating an irradiation time of a beam to each pixel, for the each pixel of a plurality of pixels which are obtained by dividing a writing region of a target object and each of which serves as an irradiation unit region per beam of multi charged particle beams;
calculating, for the each pixel, a gray-scale value of gradation by gray scale levels by dividing the irradiation time by a quantization unit;
correcting, for each group of a plurality of groups each composed of adjacent pixels, dose errors each caused by the gradation, by gray scale levels, of the irradiation time, said dose errors occurring in the adjacent pixels having the gray-scale value of finite value in a group concerned in the plurality of groups, by performing one of increasing and decreasing the gray-scale value of at least one pixel of the adjacent pixels having the gray-scale value of finite value in the each group by 1; and
writing a pattern on the target object with the multi charged particle beams, based on a gray-scale value of the each pixel in the each group for which the dose errors each caused by the gradation by gray scale levels have been corrected.

* * * * *